US006298472B1

(12) United States Patent
Phillips et al.

(10) Patent No.: US 6,298,472 B1
(45) Date of Patent: Oct. 2, 2001

(54) BEHAVIORAL SILICON CONSTRUCT ARCHITECTURE AND MAPPING

(75) Inventors: Christopher E. Phillips, San Jose; Dale Wong, San Francisco; Karl W. Pfalzer, San Jose, all of CA (US)

(73) Assignee: Chameleon Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/307,174

(22) Filed: May 7, 1999

(51) Int. Cl.[7] ................................................. G06F 17/50
(52) U.S. Cl. ................................................................ 716/18
(58) Field of Search ................................................. 716/18

(56) References Cited

U.S. PATENT DOCUMENTS

| | | | |
|---|---|---|---|
| 5,841,663 | * 11/1998 | Sharma et al. | 364/490 |
| 5,995,736 | * 11/1999 | Aleksic et al. | 395/500.19 |
| 6,026,228 | * 2/2000 | Imai et al. | 395/500.19 |
| 6,044,211 | * 3/2000 | Jain | 395/500.19 |

* cited by examiner

Primary Examiner—John F. Niebling
Assistant Examiner—Stacy Whitmore
(74) Attorney, Agent, or Firm—Burns Doane Swecker & Mathis

(57) ABSTRACT

A system and method of logic synthesis uses a behavioral synthesis tool to convert a behavioral language description (e.g., behavioral description code, an intuitive algorithm, or programming language description) of an ASIC into a partitioned RTL language description including RTL sub-descriptions corresponding to each of control, datapath, and memory. Each of the higher level RTL sub-descriptions is then mapped directly (i.e., a one-to-one mapping correspondence) to re-configurable silicon structures without requiring an RTL synthesis tool to translate the RTL description into individual standardized cell logic gates and interconnect level description. The silicon structures are controlled by the RTL sub-descriptions to provide a direct synthesized physical implementation of the ASIC thereby providing a single step synthesis method of going from a behavioral description to a synthesized silicon implementation.

36 Claims, 19 Drawing Sheets

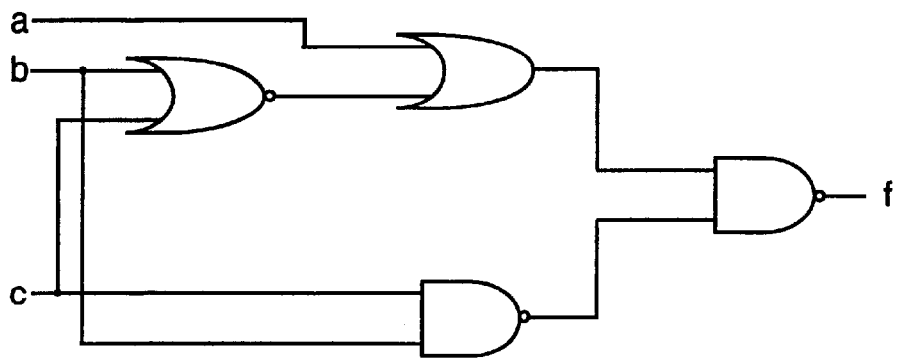
FIG._1
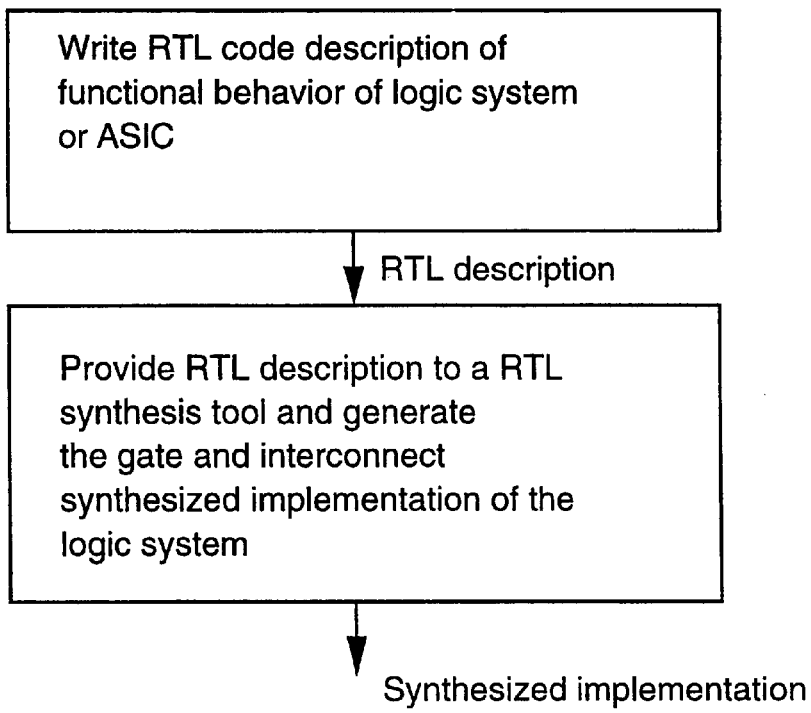
FIG._2
*(PRIOR ART)*

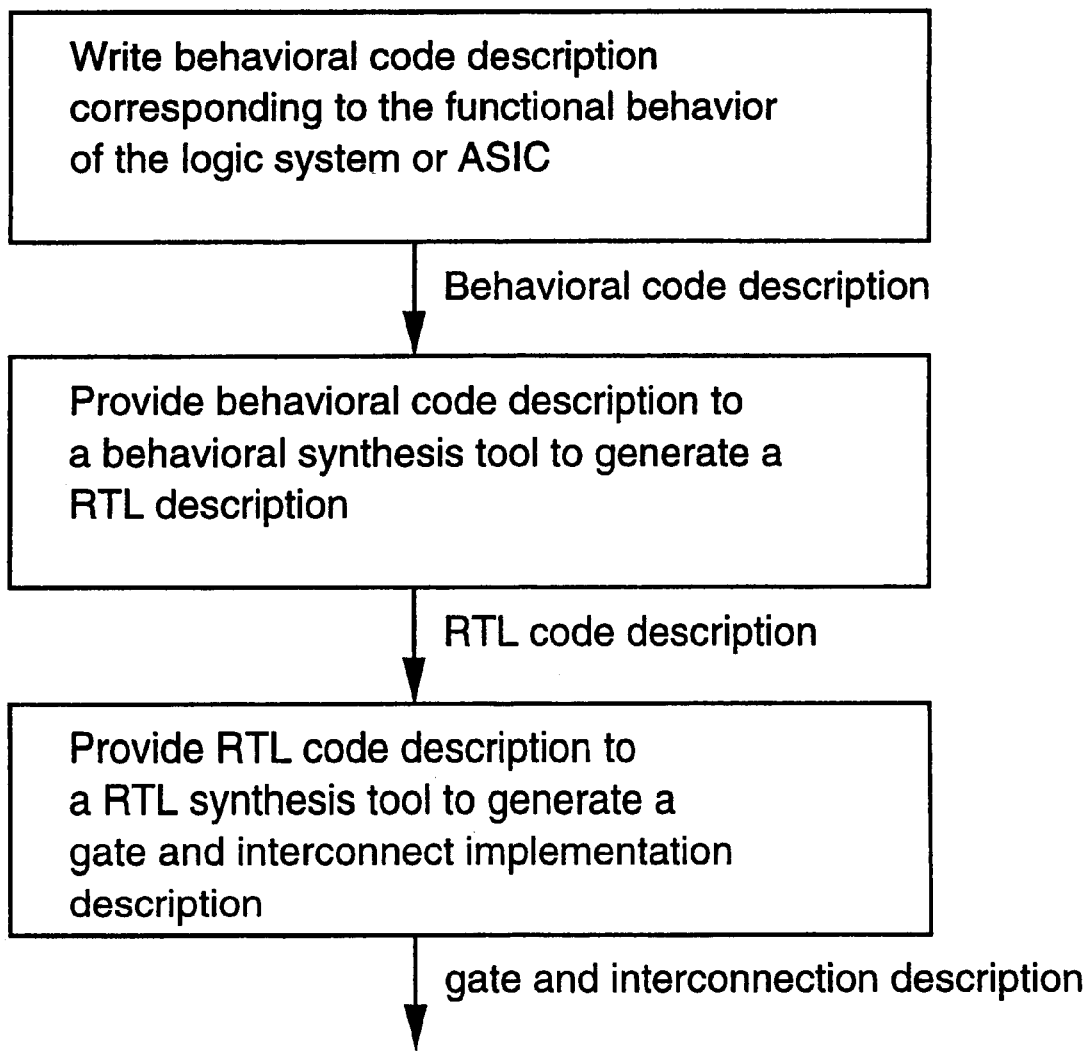
FIG._3
*(PRIOR ART)*

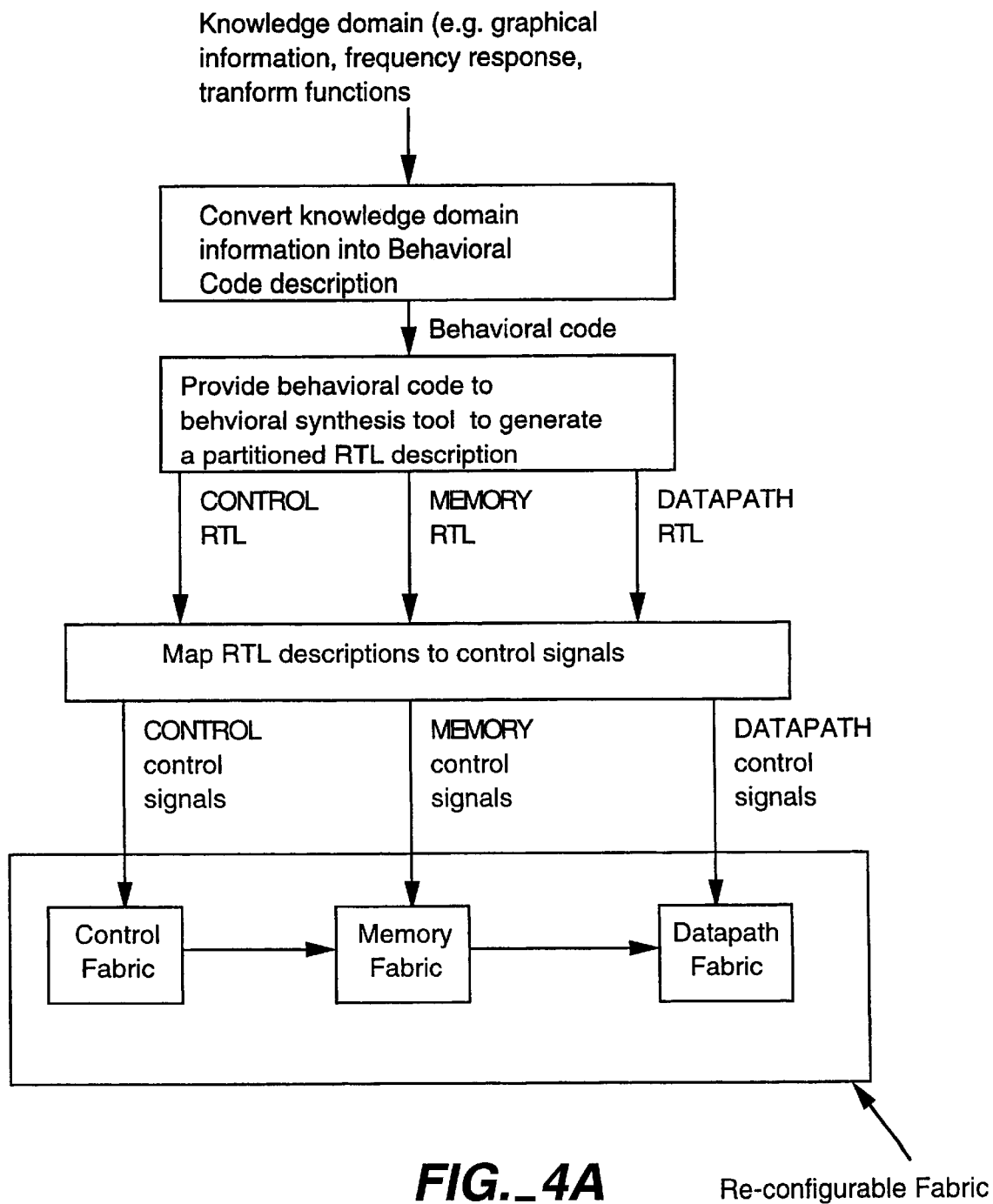
FIG._4A

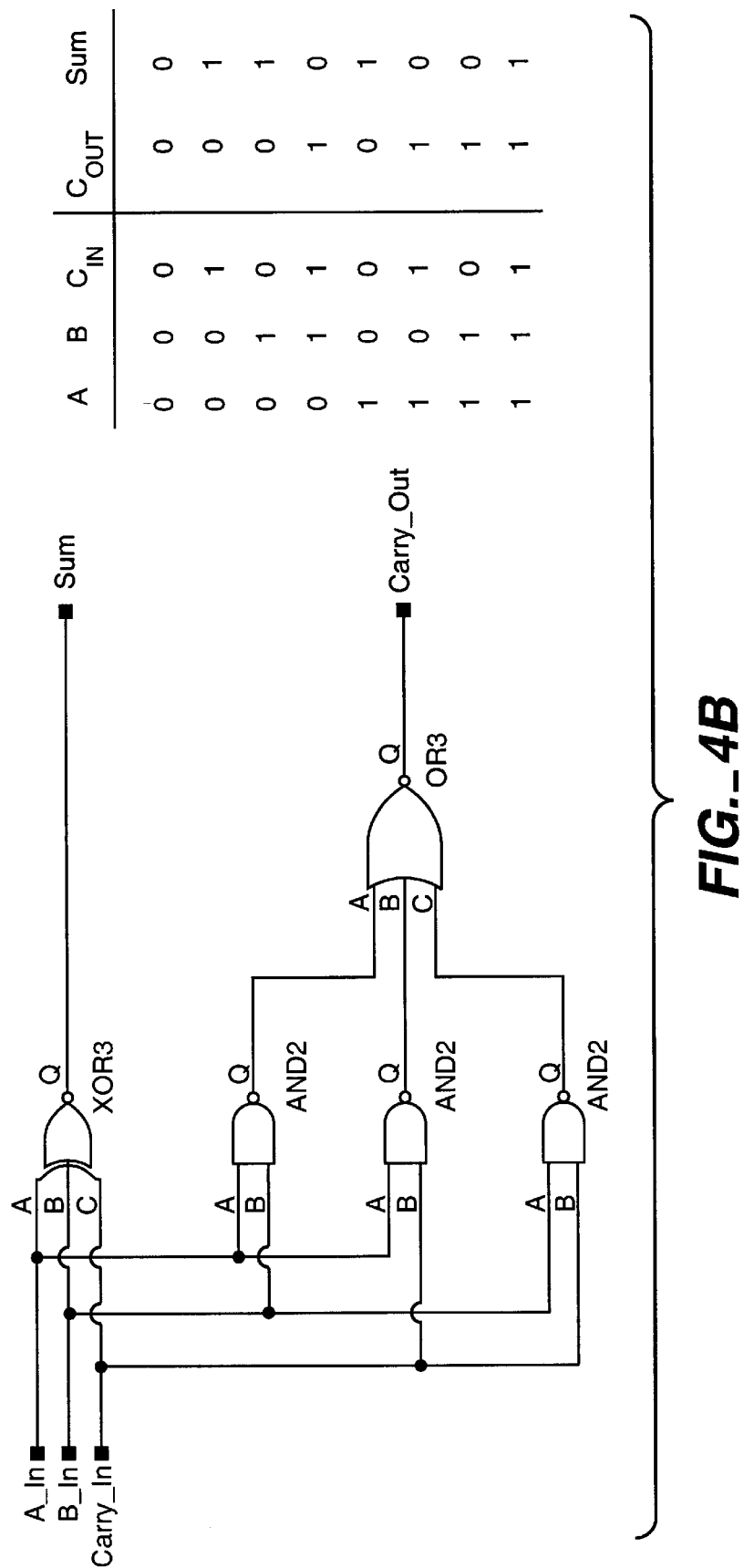
FIG._4B

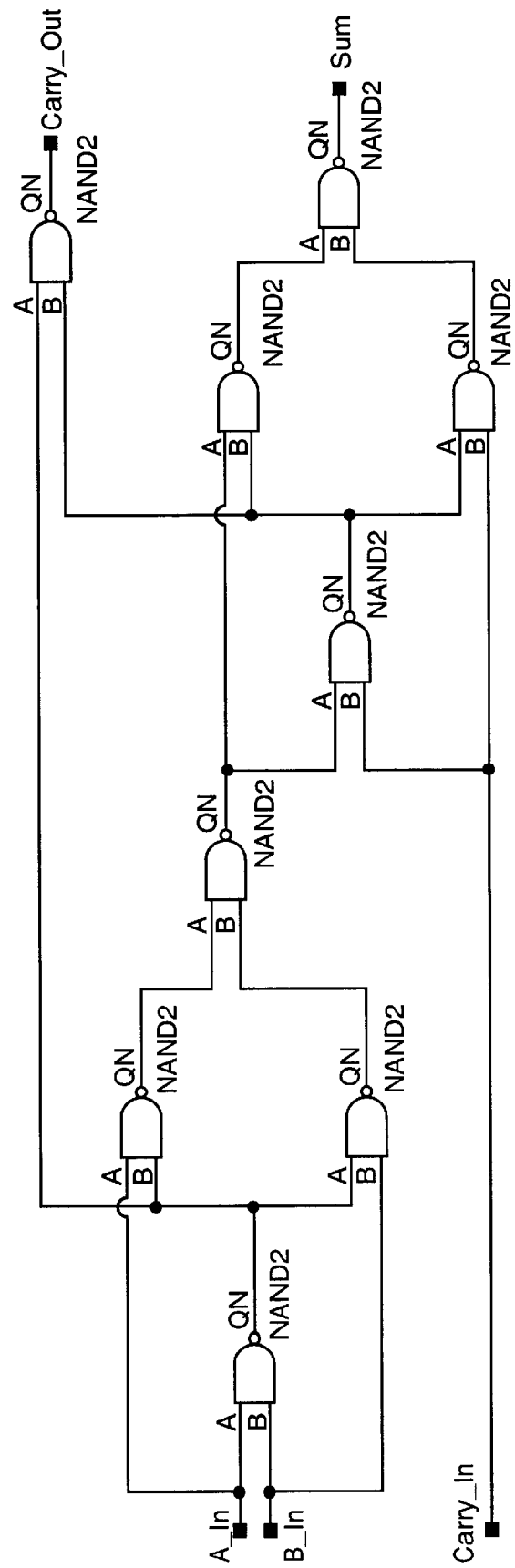
FIG._4C

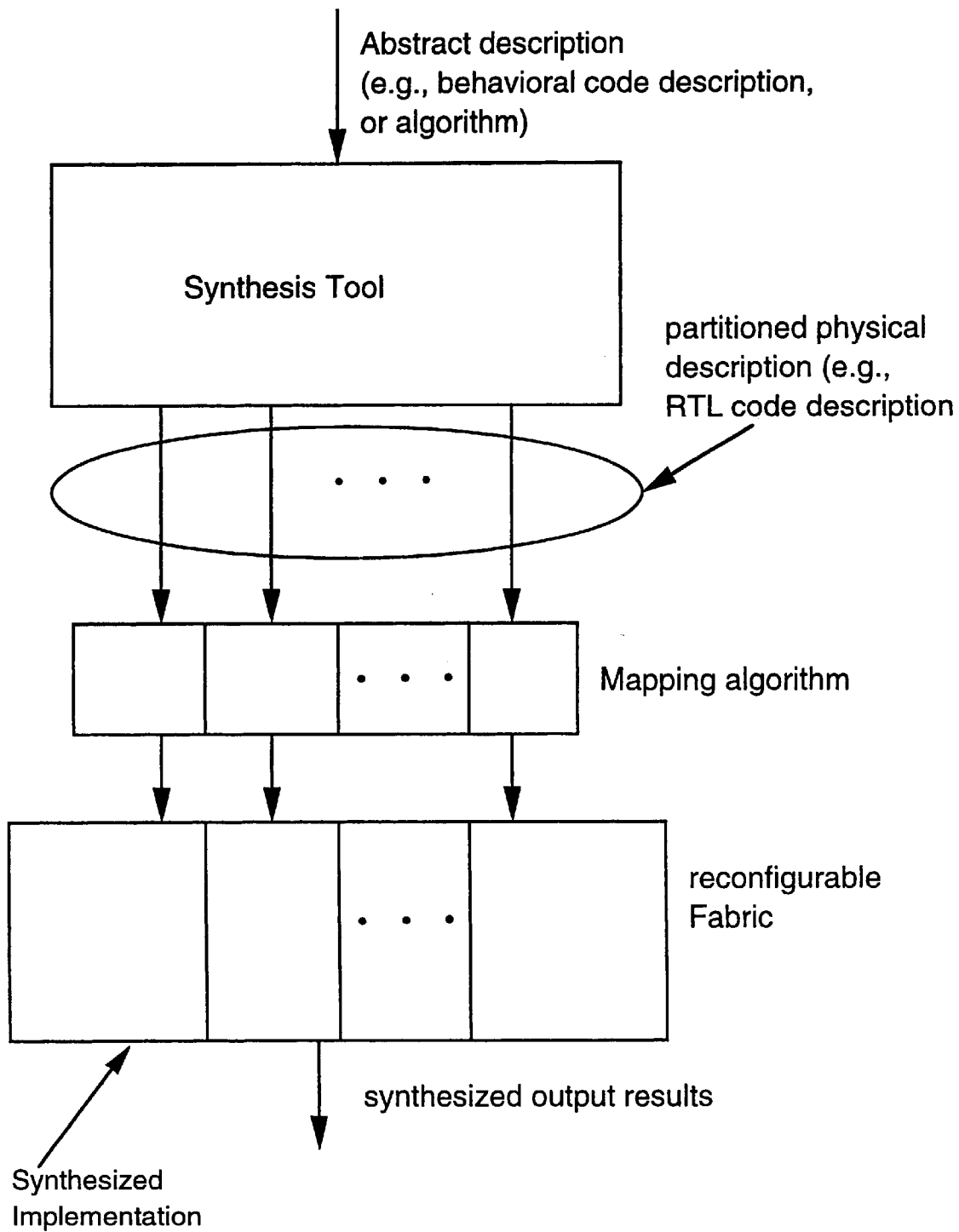
FIG._5

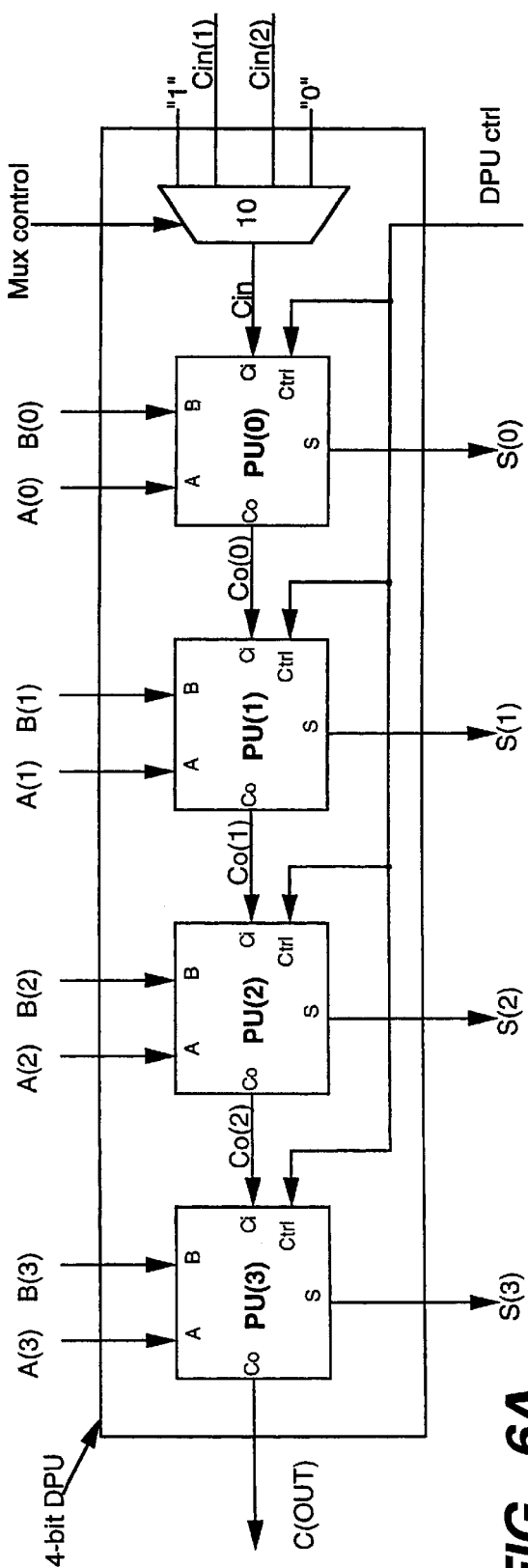
FIG._6A
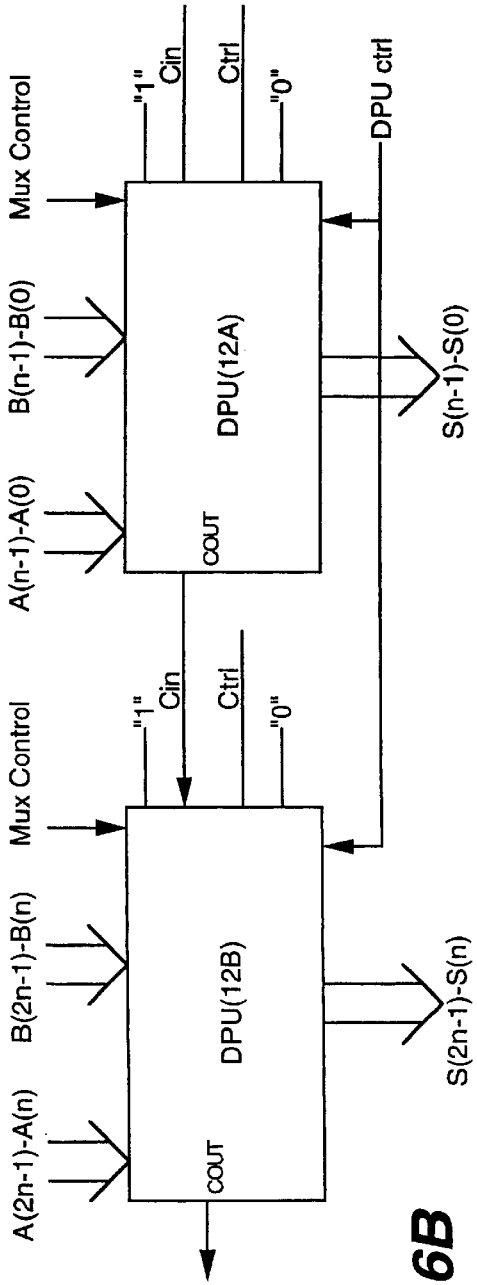
FIG._6B

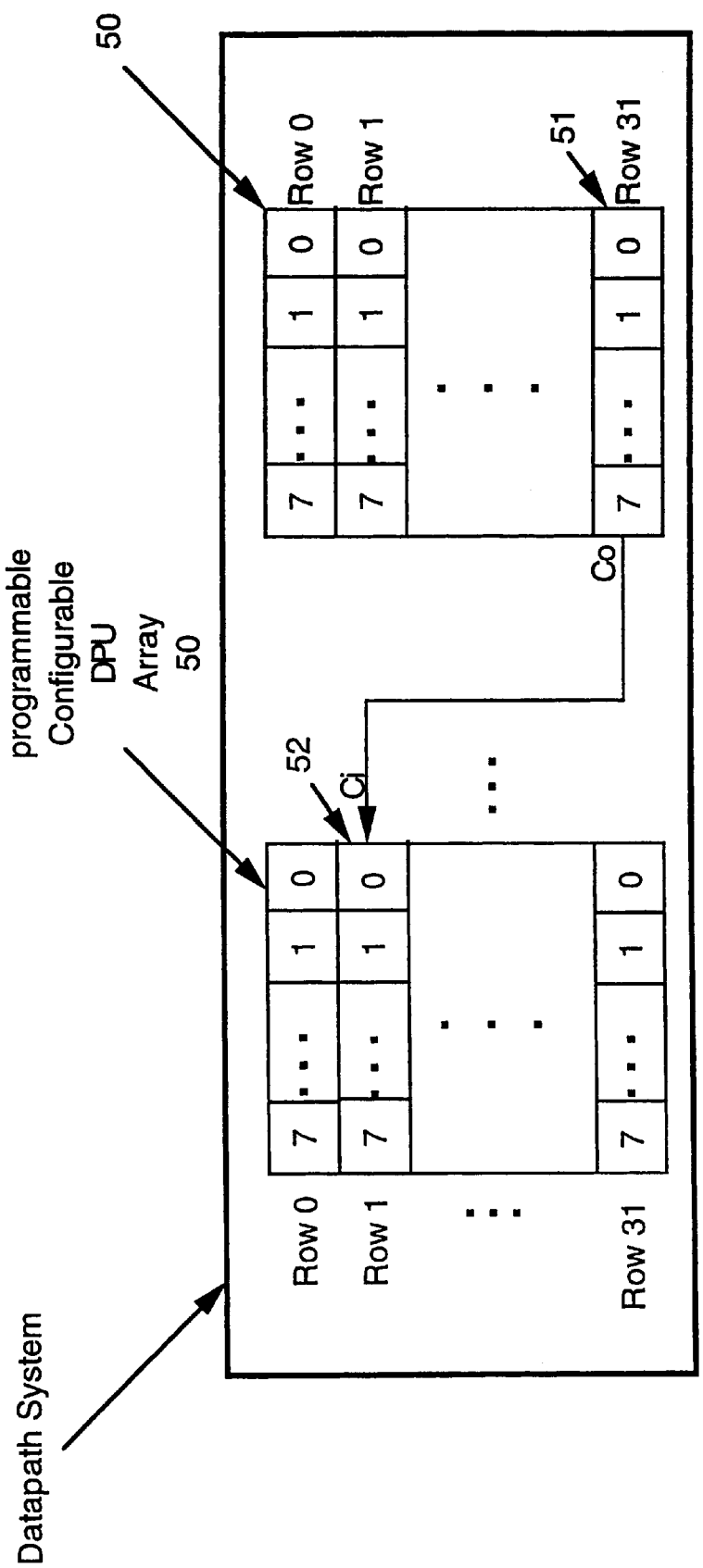
FIG._6C

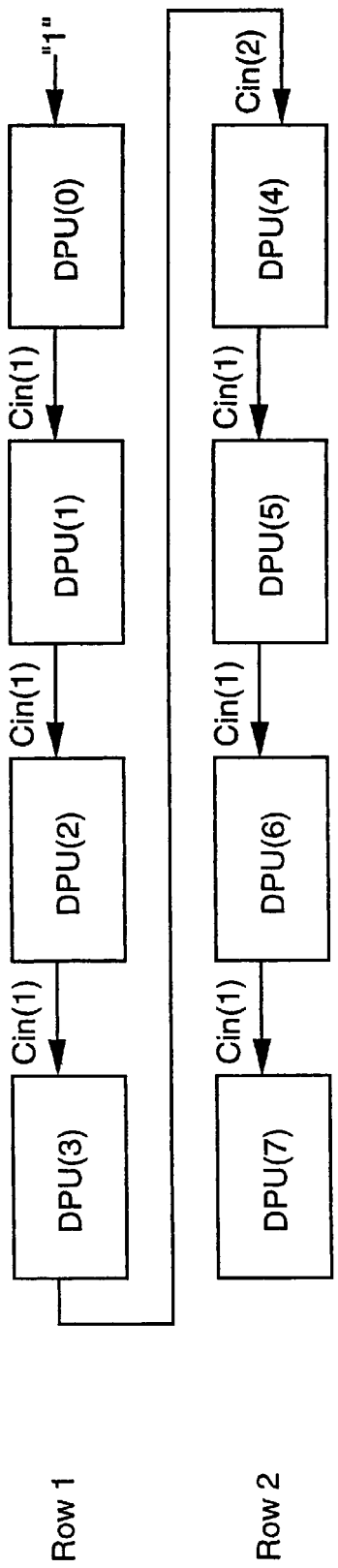
FIG._6D
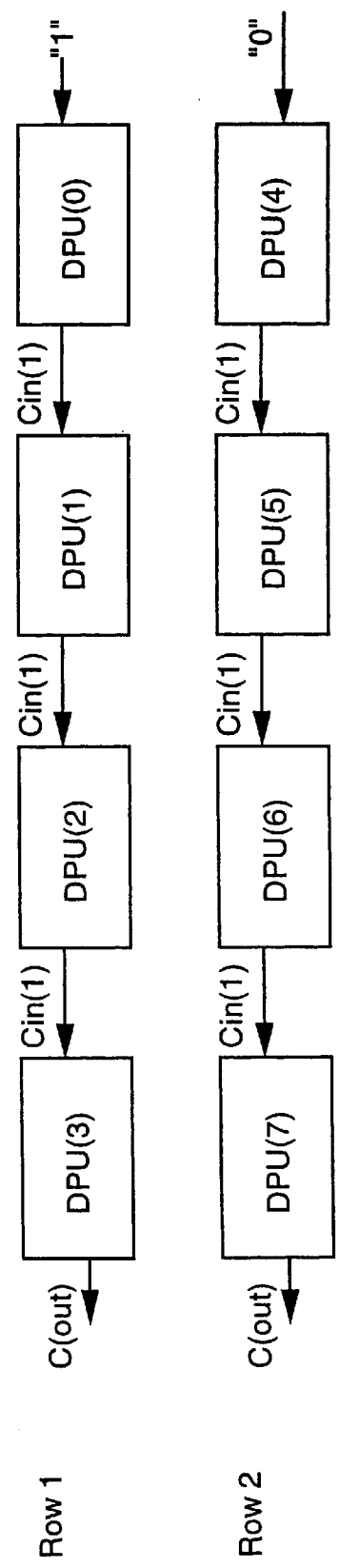
FIG._6E

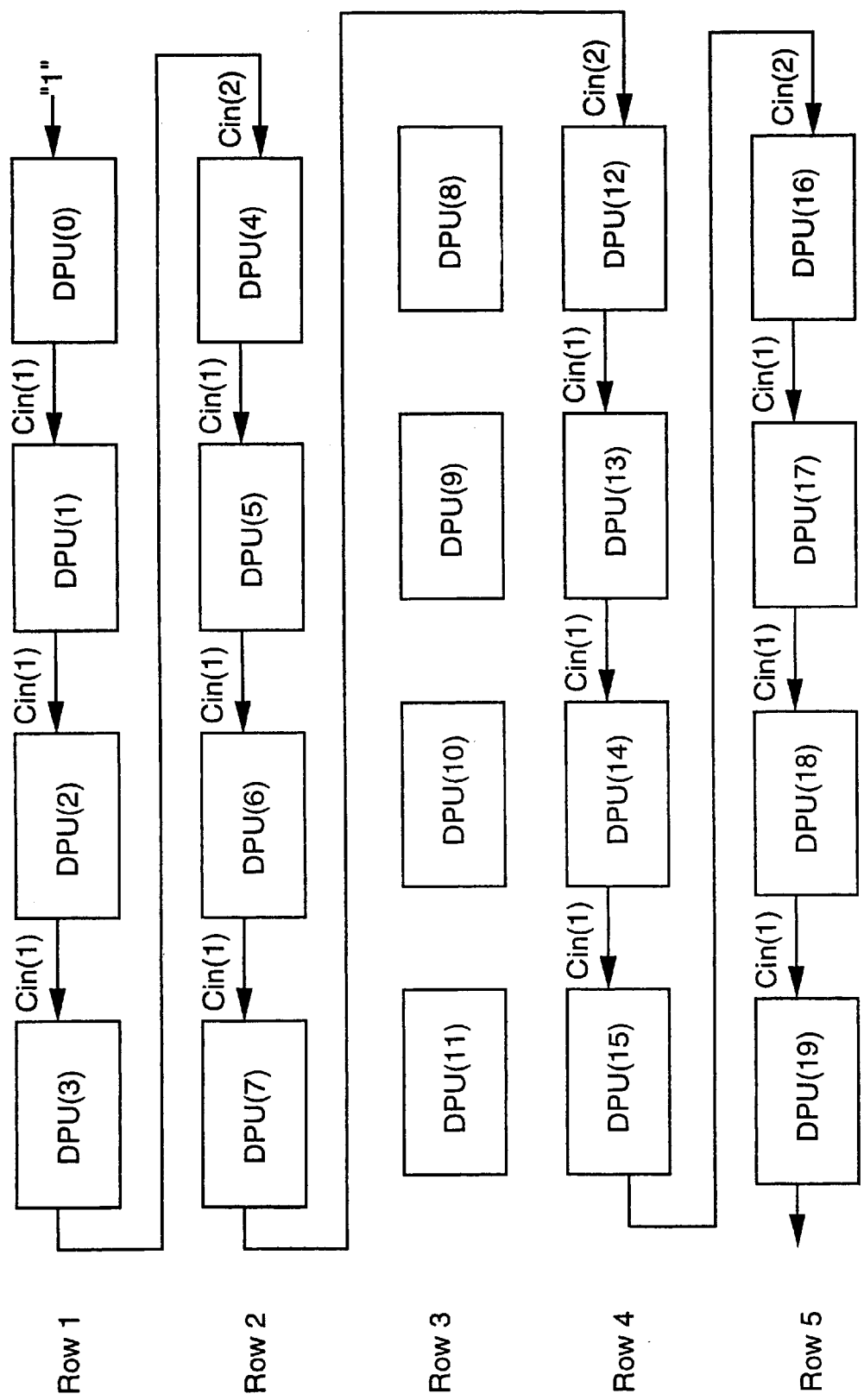
FIG._6F

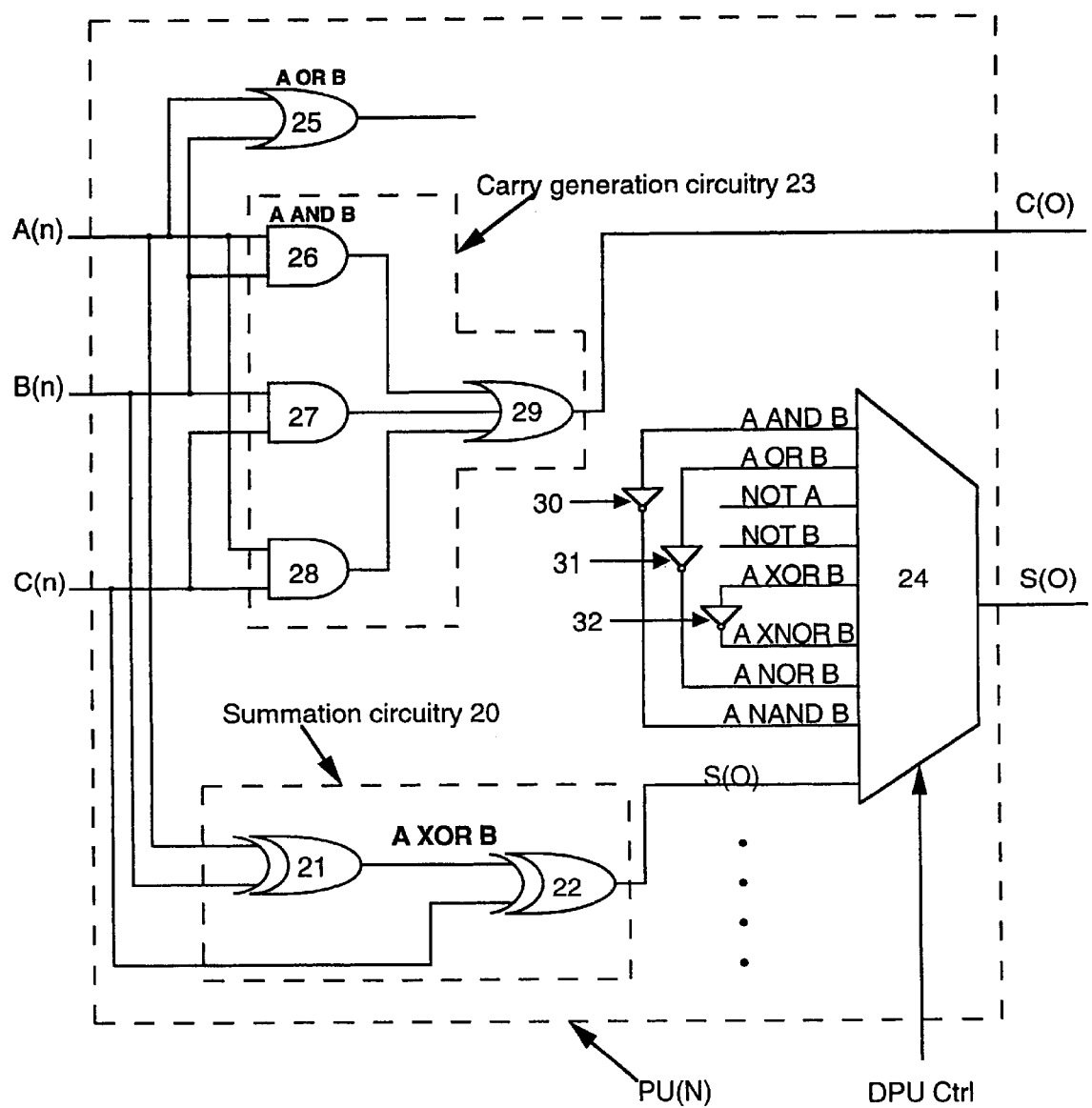
FIG._6G

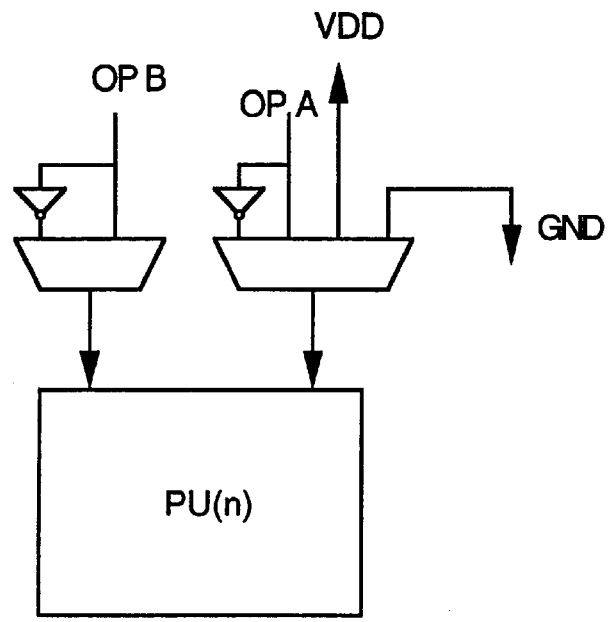
FIG._7A
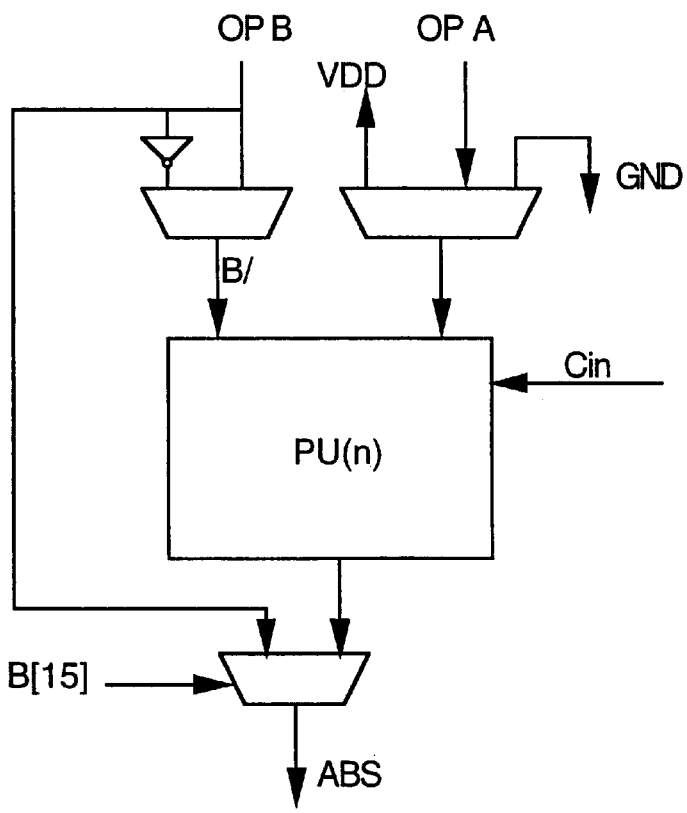
FIG._7B

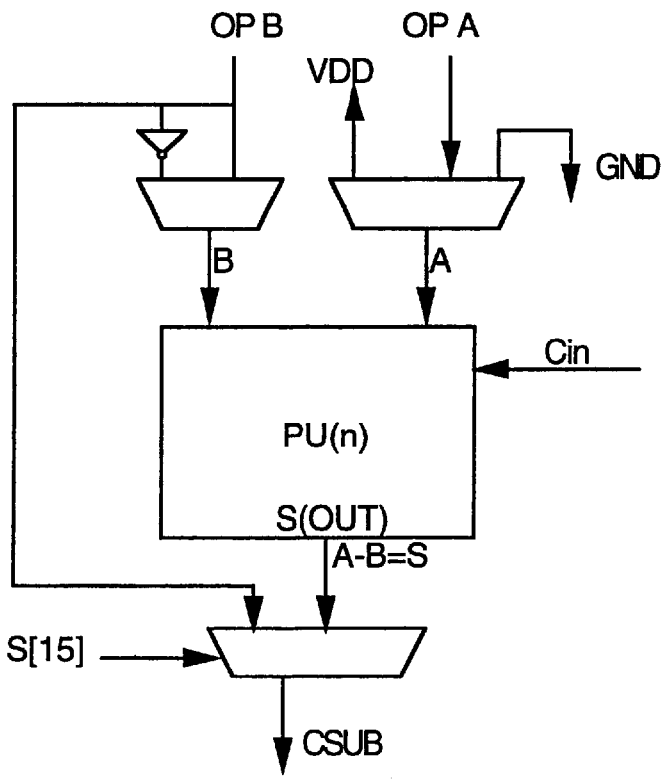
FIG._7C
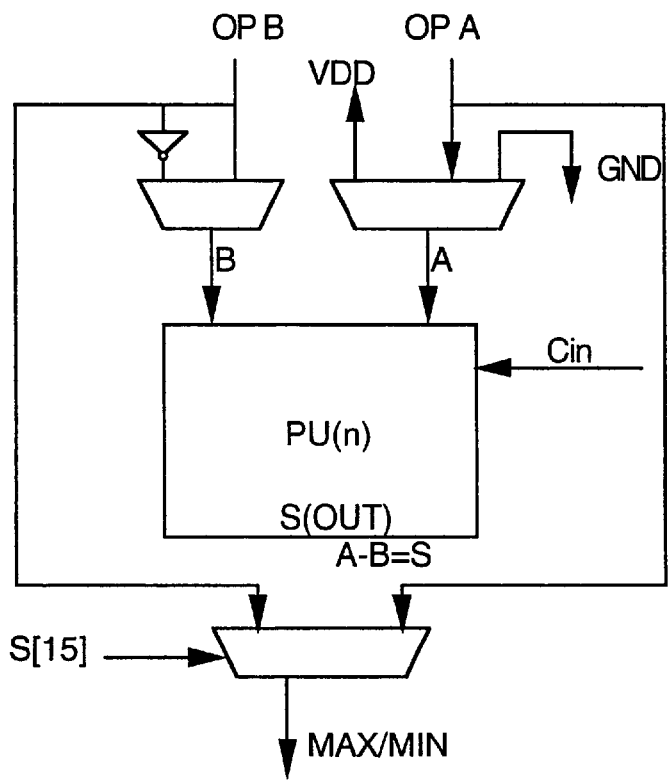
FIG._7D

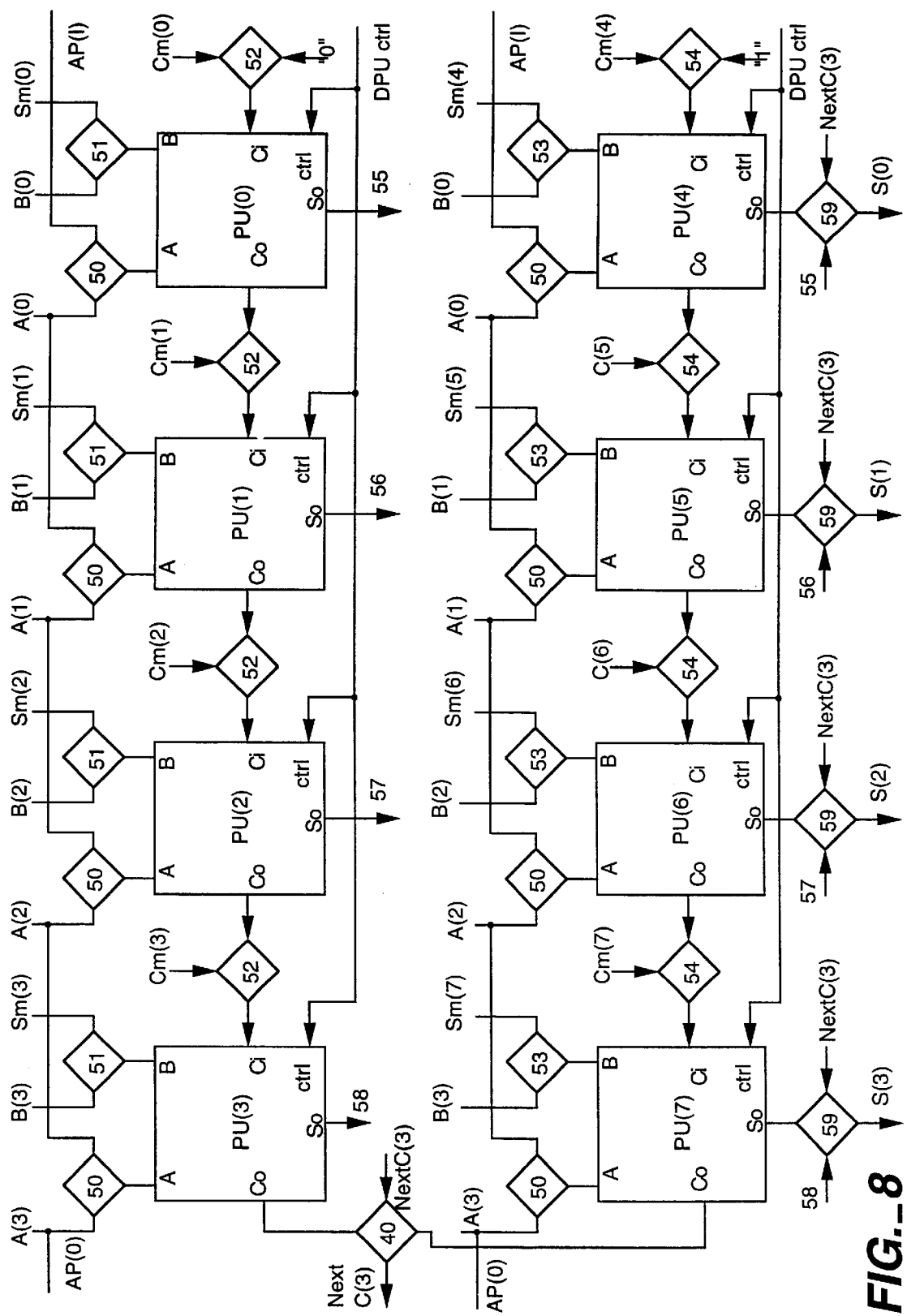
FIG._8

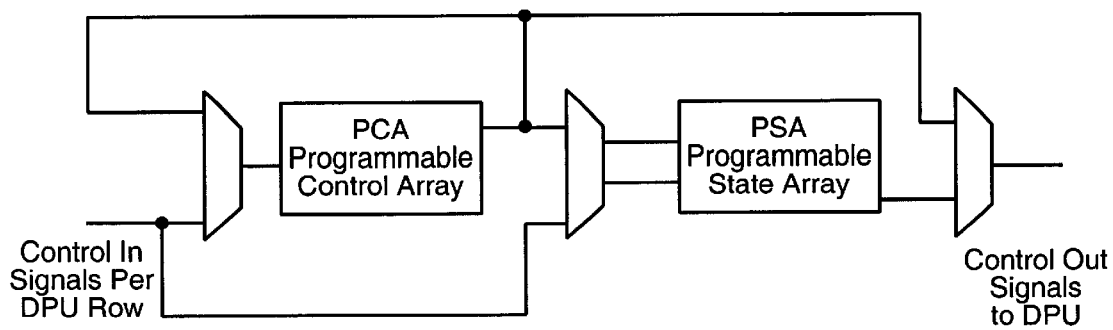
FIG._9
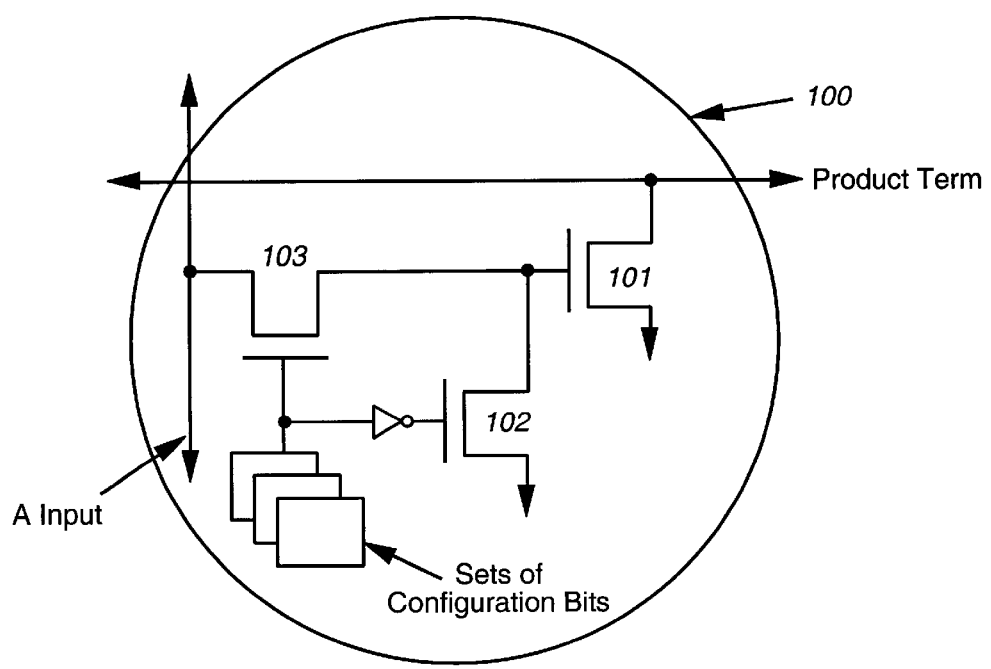
FIG._10B

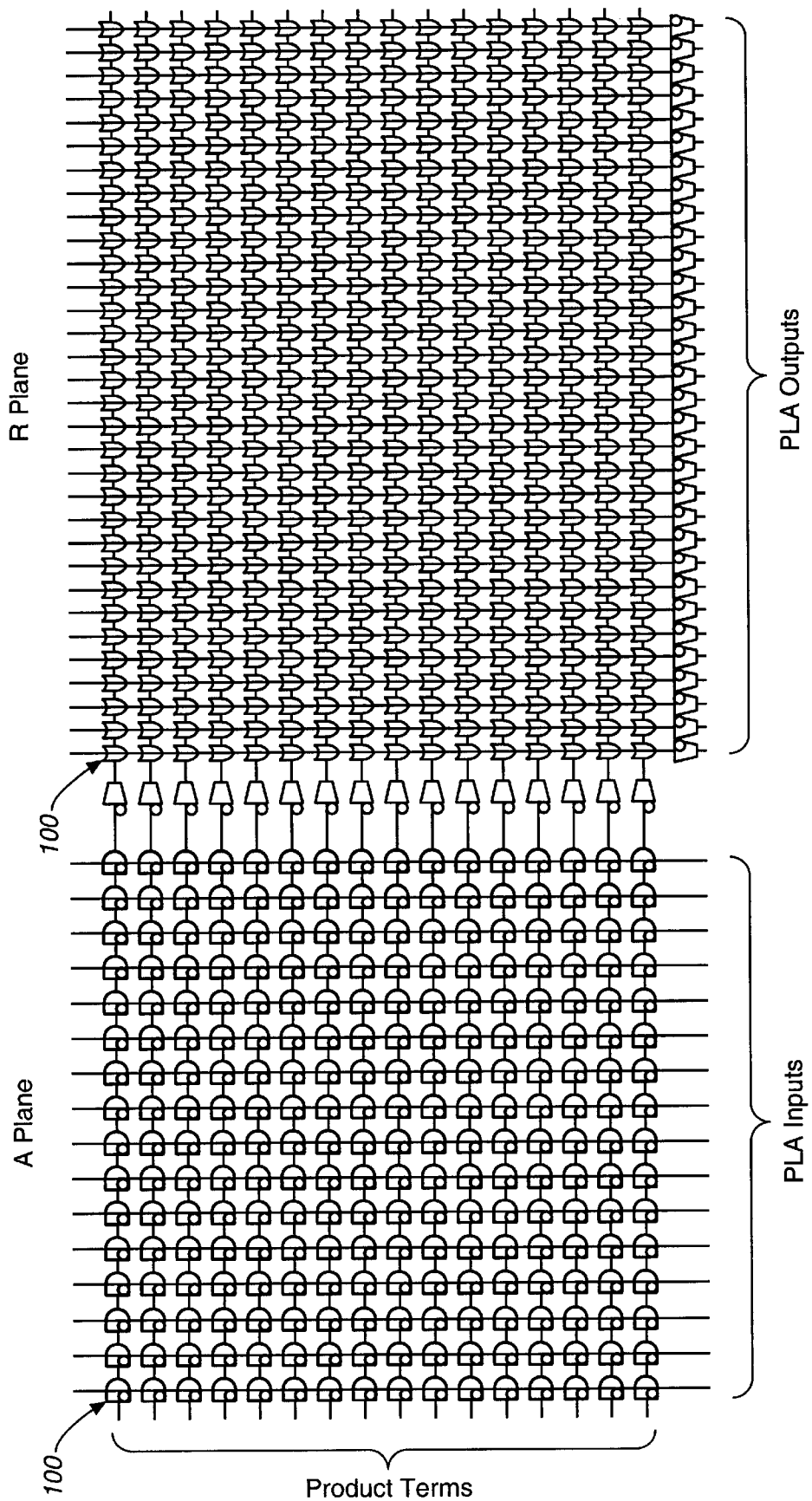
FIG._10A

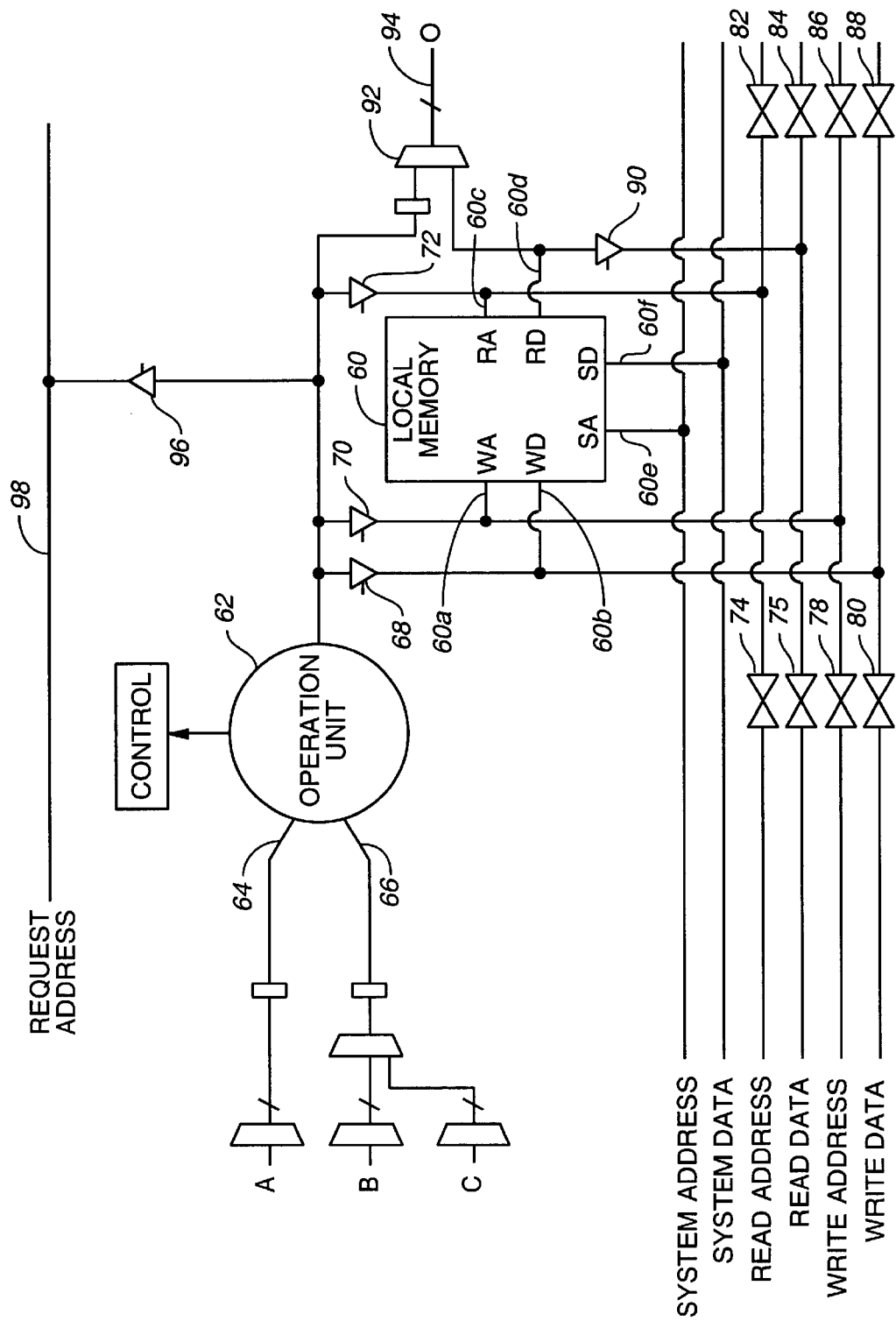
FIG._11A

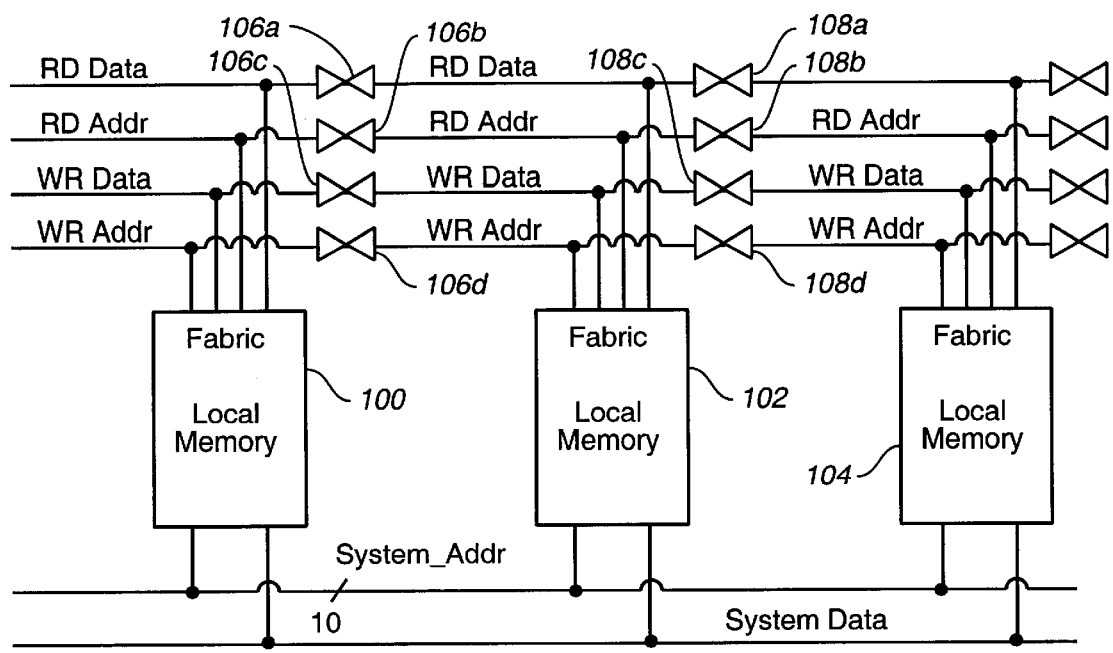
FIG._11B
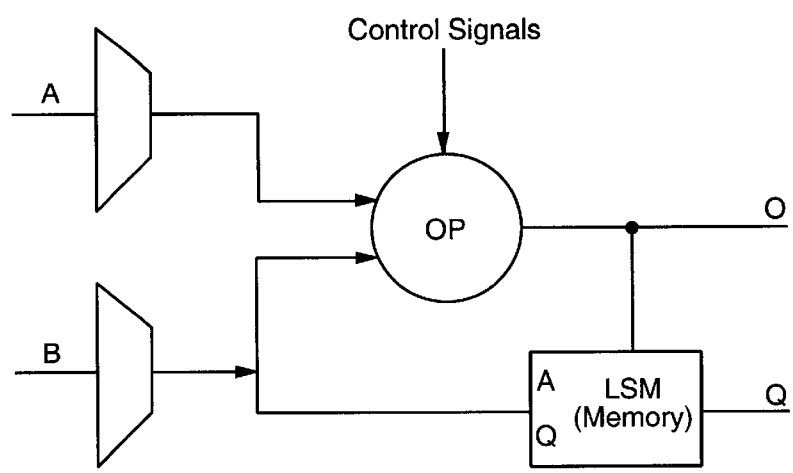
FIG._12A
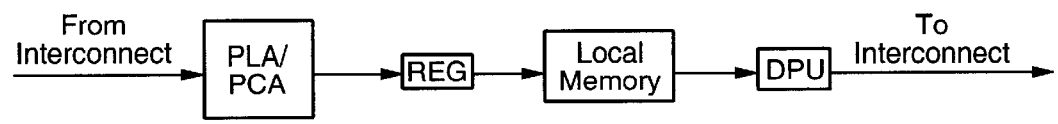
FIG._12B

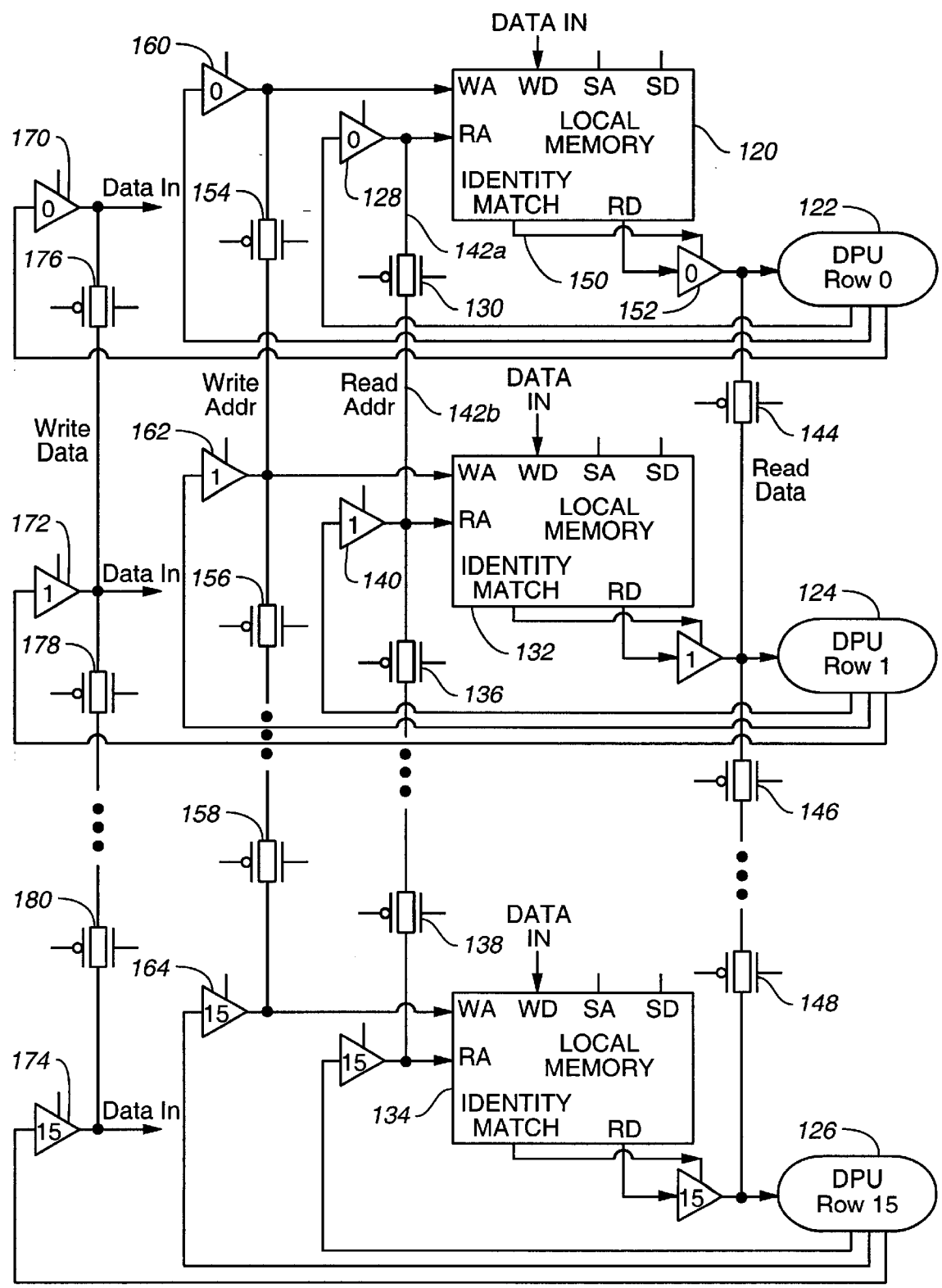
FIG._11C

BEHAVIORAL SILICON CONSTRUCT ARCHITECTURE AND MAPPING

BACKGROUND OF THE INVENTION

1. Field of the Invention

The present invention relates to logic synthesis of a logic circuit or ASIC.

2. State of the Art

Logic synthesis tools are used to interpret a description of a hardware circuit or logic ASIC so as to generate a final optimized silicon implementation of the circuit or system. Currently, most logic hardware (e.g., in ASIC form) is modeled and simulated by a designer writing an RTL (register-transfer level) description which corresponds to the function to be performed by the hardware or system. A RTL description is a hardware description language (HDL) description which describes the ASIC in terms of structural elements such as AND, NAND, or NOR gates. These gates are either explicitly called out or implicitly inferred by a boolean equation. The RTL description may also specify sequential elements such as latches and flip flops. There may also be a finite state machine description specifying a state transition graph. The following is an example of an RTL description:

EXAMPLE 1

```
module synAssign (f, a, b, c);
    output f;
    input a, b, c;
    assign f = (a & b & c) | (a & -b & -c) | (-a & (b|c));
endmodule
```

The RTL language description is then used as input into a RTL synthesis tool which first reads and manipulates the RTL description in order to simplify the combinational logic, maps the manipulated description to a library of available standard cells, and then generates a description of the circuit in terms of actual physical gates and wire connections usable by a CAD tool to design the final gate level structure of the system. Essentially, a logic synthesis tool reads the logic functionality specified by the RTL description and tries to optimize the final gate design with respect to design constraints and library elements. FIG. 1 shows an example of a synthesized hardware design implementation of the RTL description shown in EXAMPLE 1 using specified standard cells within the library of the synthesis tools. Other hardware design implementations are possible with alternate libraries and performance constraints. FIG. 2 summarizes the steps performed to obtain a hardware description using RTL synthesis which basically includes writing a RTL description which corresponds to the functional behavior of an ASIC or logic system and providing the RTL description to a RTL synthesis tool which, in turn, generates a corresponding gate and interconnect description.

Part of the problem with using RTL descriptions and synthesis to simulate logic hardware is that it is easier for designers to view and understand a complex logic ASIC at more of an abstract or functional level than at a RTL gate level. For instance, a designer might want to design a piece of hardware which performs some transform function on an input signal and generates an output signal in a specified number of cycles and having a specified number of pipelines. Ideally, a designer would like to describe the function of the ASIC or a programming kernal of computation in terms of a programming language (e.g., C programming language), provide this to a synthesis tool, and generate a hardware description of the ASIC which can be easily manipulated to view different implementations of the ASIC optimized for different design considerations. The prior art method does not provide this capability. Another significant disadvantage of the prior art method is that the task of describing an algorithm or circuit function in terms of a RTL description can take many man-years of effort for complex algorithms as in a system that performs a quadrature amplitude modulation (QAM) using functional building block functions such as a FFTs (Fast Fourier Transforms).

Recently, in order to close the gap between the RTL type level description and the abstract level description design technique as desired by system designers, a behavioral synthesis technique has been developed which allows the designer to describe the ASIC in terms of abstract constructs via a behavioral language. Hence, whereas traditional RTL descriptions correspond to individual system level hardware components (e.g. AND, OR gates), a behavioral description in no way implies a specific piece of hardware. For instance, writing a "+" operator in an RTL description creates an instance of a specific adder or declaring a variable A creates a register. However, when an addition operation is specified in a behavioral description, this in no way implies what particular type of adder will be part of the hardware implementation. In fact, a behavioral description can closely resemble a programming language. The following is an example of a Verilog behavioral description:

EXAMPLE 2

```
@(posedge Clock)      //St1
A;
while (flag1) begin
    B;
    if (flag2) begin
        C;
        @(posedge Clock)    //St2
        D;
    end
    else begin
        E;
        @(posedge Clock)    //St3
        F;
    end
end
G;
@(posedge Clock)      //St4
H;
```

As can be seen in EXAMPLE 2, gates are not explicitly called out and instead the description is in terms of clock edges (e.g., @(posedge Clock)), states St1–St4, and process loops A–H.

The behavioral language is provided to a behavioral synthesis tool which then generates a RTL language description. This process is referred to as behavioral synthesis. The RTL description specifies the functional elements for implementing the logic design depending on the functional units and operators that are available to the behavioral tool (e.g., ALUs, memories, registers, muxes, and controllers). In general each behavioral tool includes a library of functional units and operators which it uses to generate a RTL description. The RTL description is then provided to a RTL synthesis tool which in turn generates a hardware description of the ASIC in terms of standard gates and their interconnections according to the RTL synthesis tool's specified cell library.

FIG. 3 summarizes the steps performed to obtain a hardware description using behavioral synthesis which basically includes writing a behavioral description corresponding to the function of an ASIC or logic hardware, providing the behavioral description to the behavioral synthesis tool so as to generate a RTL description of the ASIC or logic hardware, providing the RTL description to a RTL synthesis tool which, in turn, generates a corresponding gate and interconnect description. The disadvantage of the behavioral synthesis technique is that in reducing the ASIC to a gate level description, the designer loses significant capability and flexibility to manipulate the ASIC in terms of larger system adjustments since the gate level description only allows for gate level adjustments. Moreover, behavioral synthesis is a longer multi-step complex process requiring two synthesizing steps.

What would be desirable is a single step synthesis process which accepts a higher level (i.e., abstract) description language such as a programming language as its input while avoiding the additional step of reducing a subsequent RTL description to a gate level implementation.

SUMMARY OF THE INVENTION

A system and method of logic synthesis is provided which allows a system designer to go directly from an intuitive algorithm or programming language description of an ASIC to an RTL description and then directly to a synthesized physical implementation of the ASIC, where a one-to-one mapping exists from the RTL description to the physical implementation thereby significantly reducing the design time of the ASIC.

In one embodiment, the system and method of logic synthesis performs a behavioral synthesis on a behavioral description of an ASIC to generate an RTL description. The RTL description is partitioned into RTL sub-descriptions corresponding to each of the control, datapath, and memory portions of the ASIC. The behavioral description can be embodied as a programming language, an algorithm describing a function of an ASIC, kernals of computation in a C program language format (or syntax) within a higher level C program, or a conventional behavioral description having a syntax as prescribed by a selected behavioral synthesis tool. The RTL description is at a level of abstraction which defines functional units (not individual gates and gate connections) which can, in one embodiment, include adders, subtractors, multiplexers, and registers and can also include a variety of primitive operators associated with the behavioral synthesis tool.

Each of the RTL sub-descriptions is then technology mapped directly (i.e., a one-to-one mapping correspondence) to silicon structures thereby obviating the prior art conversion from a RTL description to a standardized cell logic gate and interconnect level description. The method and system is implemented using a re-configurable fabric comprising system level silicon structures which are controlled by the RTL sub-descriptions.

In one embodiment, the behavioral description is in a form that follows a pre-existing behavioral synthesis tool's prescribed syntax rules. The RTL description generated by the tool is then intercepted prior to the final conventional transformation of RTL-to-gate and interconnect hardware level and instead is mapped to the inputs of the re-configurable fabric. The re-configurable fabric is adapted to receive the RTL description generated by the pre-existing behavioral tool and in particular the higher level descriptions of the functional elements and operators which are defined within the RTL sub-descriptions.

In one embodiment, the re-configurable fabric includes a datapath unit (DPU) for mapping the RTL sub-description corresponding to the datapath processes. The DPU is controlled to perform any high level functions such as logic functions, arithmetic functions, conditional functions, or custom functions such as accumulate (ACC) or multiply accumulate (MAC).

The re-configurable fabric also includes LSMs (local storage modules) for mapping the RTL sub-description corresponding to memory. The LSMs form a re-configurable memory system which can be aggregated to build varying sizes of memory and enable and various modes of ports. The re-configurable fabric also includes CLUs (control logic units) for mapping the RTL sub-description corresponding to control. The CLUs include re-configurable programmable sum of product (PSOP) term generators for generating system control signals as well as memory for storing and providing control signals.

BRIEF DESCRIPTION OF THE DRAWINGS

The present invention may be further understood from the following written description in conjunction with the appended drawings. In the drawings:

FIG. 1 shows an example of a synthesized hardware implementation resulting from a RTL language description;

FIG. 2 shows a flow chart illustrating a first prior art method of register-transfer-level (RTL) synthesis;

FIG. 3 shows a flow chart illustrating a second prior art method of behavioral synthesis;

FIG. 4A shows a first embodiment of the logic synthesis technique of the present invention;

FIGS. 4B and 4C illustrates an example of technology mapping of a full adder;

FIG. 5 shows a first embodiment of a system for performing the logic synthesis technique of the present invention;

FIG. 6A is a first embodiment of a programmable and configurable datapath unit (DPU);

FIG. 6B is one embodiment of a datapath circuit in which two DPUs are connected;

FIG. 6C shows a datapath system implemented with a plurality of configureable and programmable arrays of DPUs;

FIGS. 6D–6F show different configurations of interconnecting and programming rows of DPUs in an array of DPUs;

FIG. 6G is one embodiment of a single-bit processing unit (PU) embodied as a modified adder implemented within a DPU;

FIG. 7A shows one embodiment of the selective application of the operands to the PUs of the present invention;

FIG. 7B shows a PU circuit implementation for performing a absolute value operation (ABS);

FIG. 7C shows a PU circuit implementation for performing a conditional subtraction (CSUB);

FIG. 7D shows a PU circuit implementation for performing a MAX or MIN operation;

FIG. 8 shows a second embodiment of a programmable and configurable DPU;

FIG. 9 shows one embodiment of a control logic unit (CLU) including a programmable control array (PCA) and a programmable state array (PSA);

FIG. 10A shows an embodiment of a programmable control array (PCA) implemented as a programmable and configurable PLA;

FIG. 10B shows a programmable connection within the embodiment of the PCA shown in FIG. 10A;

FIG. 11A is a diagram showing memory configurability of a single local memory with a logical representation of a single DPU;

FIG. 11B shows memory configurability of a plurality of local memories;

FIG. 11C shows memory configurability of multiple DPUs and local memories;

FIG. 12A shows a functional block diagram illustrating the interaction of control, datapath, and memory in the re-configurable fabric; and FIG. 12B shows control signals between the control and datapath portions of the re-configurable fabric.

DETAILED DESCRIPTION OF THE PREFERRED EMBODIMENTS

FIG. 4A shows a first embodiment of the steps of performing a single synthesis step method of logic synthesis using a abstract level of description as an input and FIG. 5 shows a first embodiment of the system for performing logic synthesis thereof.

In general when performing logic synthesis, prior to generating a behavioral description, a system designer characterizes the system in terms of graphical information which describe, for example a filter function or a wave excitation function. The system may also be characterized in terms of an input/output frequency response. This information might be referred to as the knowledge domain 10 (FIG. 4A). The knowledge domain information is then transformed into behavioral code using a synthesis tool such as the SPW or Alta synthesis tools.

The behavioral code describes the function defined by the knowledge domain information in terms of encoded statements having a pre-defined syntax in accordance with a particular behavioral synthesis tool. In general, behavioral code might specify the input/output behavior of the system, a process behavior or computation, input/output timing relationships, a description of the clock or clocks, and a description of the reset behavior of a process. Often times the behavior code is in terms of always or clock edge statements.

EXAMPLE 2 (above) shows a behavioral Verilog description code used as input into a Rapid Path 3.2 behavioral synthesis tool. As can be seen, the description includes algorithmic loops formed by abstract statements such as while and else statements which are not possible in the non-abstract based RTL/gate language. Moreover, @(posedge Clock) statements are also used to define the process or module in terms of clock cycles. It should be noted that although traditional RTL descriptions are also described in terms of clock cycles, these clock cycle statements relate to specific hardware components whereas the clock cycles in behavioral statements correspond to specific abstract processes or steps which in no way infer a specific hardware element. Alternatively, the behavioral code may be embodied as kernals of computation in a C program language format or syntax within a higher level C program.

The behavioral code generated by the behavioral code generation tool is provided as input to a behavioral synthesis tool which performs scheduling and allocation so as to generate a sequential intermixed listing of RTL description statements including datapath, control, and memory RTL description statements. Moreover, during behavioral synthesis, a dataflow graph is generated by the synthesis tool. The dataflow graph essentially provides a simple means of differentiating between the intermixed RTL statements thereby faciliatating the partitioning of the RTL description statements into: 1) a datapath RTL description which includes definitions of functional units and their input and output characteristics, and operations specified in terms of allowed behavioral synthesis tool pre-defined operators; 2) a control RTL description which specifies state information and boolean equations defining, in part, the control to be applied to the datapath; and 3) a memory RTL description which specifies the modality of the ports of the memory and the size required for the system.

The datapath RTL description is a listing (also referred to as a netlist) which specifies functional units (which can include adders or subtractors) and primitive operations including logical operations, arithmetic operations, conditional operations, multiplexer operations, and custom operations as specified by the behavioral synthesis tool. An example of one format used by the RapidPath 3.2 Verilog behavioral synthesis tool to call out a functional unit (FU) is shown below:

```
FU adder
         < wordsize = 1 >
         (DATA:IN:A[0:wordsize-1],
         DATA:IN:B[0:wordsize-1],
         DATA:OUT;C[0:wordsize])
{
AREA 50 µm;
IntAdd (A,B) (C) ( ) 20ns;
};
```

An example of allowed operators defined by the RapidPath behavioral synthesis tool which can also be called out in the datapath RTL netlist are included in Table 1 below:

TABLE 1

| $converter$ | IntGQ | MixedRealDiva | ReductionNOR |
|---|---|---|---|
| $Void$ | IntGTR | MixedRealDivb | ReductionOr |
| ArrayRead | IntInc | MixedRealMulta | ReductionXnor |
| ArrayWrite | IntLEQ | MixedRealMultb | ReductionXor |
| AsYouWere | IntLSS | MixedRealSuba | Reset |
| Assign | IntMod | MixedRealSubb | Reset0 |
| BitRead | IntMult | NEQ | Reset1 |
| BitWrite | Int | NoOP | ResetZm |
| BitwiseAnd | IntSub | Now | SELECT |
| BitwiseNand | IntUnaryMin | Output | ShiftLeftus |
| BitwiseNor | LEAVE | Pass | ShiftRight |
| BitwiseNot | Load | RESTART | ShiftRightArith |
| BitwiseOr | LogicalAnd | RealAdd | SignPad |
| BitwiseXnor | LogicalNand | RealDiv | Store |
| BitwiseXor | LogicalNor | RealExp | Tristate |
| CALL | LogicalNot | RealGEQ | UIntDiv |
| ClockEdge | LogicalOr | RealGTR | UIntGEQ |
| Concat | LogicalXor | RealLEQ | UIntGTR |
| ENTER | MixedDivInt | RealLSS | UIntLEQ |
| EQL | MixedDivReal | RealMod | UIntLSS |
| Input | MixedMulReala | RealMult | UIntMult |
| IntAbs | MixedMulRealb | RealRem | Wire |
| IntAdd | MixedMultInta | RealSub | ZeroDetect |
| IntDec | MixedMultIntb | RealUnaryMinus | ZeroPad |
| IntDiv | MixedRealAdda | ReductionAnd | |
| IntExp | MixedRealAddb | ReductionNand | |

It should be noted that Table 1 includes allowable operators for any of the datapath, control, and memory RTL descriptions. For instance, intAdd would correspond to an integer addition arithmetic operator which would be found within a datapath RTL description. A memory RTL description, on the other hand, might include an ArrayRead operator.

The control RTL description lists statements defining a state machine, a state machine's corresponding case statements, and boolean equation statements to define control of the system. Each case statement defines states in a state machine. The following is an example of an RTL description including statements which define a state machine and its corresponding case statements:

EXAMPLE 3

```
module fsm (i, clock, reset, out);
    input i, clock, reset;
    output [2:0] out;
    reg [2:0] currentState, nextState;
    parameter [2:0] A=0, //The state labels and their assignments
                    B=1,
                    C=2,
                    D=3,
                    E=4,
                    F=5;
always @(i or currentState)//The combinational logic
    case (currentState)
        A: begin
            nextState=(i==0)?A:B
            out=(i==0)?3"b000:3'b100;
        end
        B: begin
            nextState=(i==0)?A:C
            out=(i==0)?3"b000:3'b100;
        end
        C: begin
            nextState = (i==0)?A:D
            out=(i==0)?3"b000:3'b101;
        end
        D: begin
            nextState = (i==0)?D:E
            out=(i==0)?3"b010:3'b110;
        end
        E: begin
            nextState = (i==0)?D:F
            out=(i==0)?3"b010:3'b110;
        end
        F: begin
            nextState=D
            out=(i==0)?3"b000:3'b101;
        end
        default: begin//oops, undefined states. Go to state A
            nextState=A;
            out=(i==0)?3'bxxx:3'bxxx;
        end
    endcase
    always @(posedge clock or negedge reset)//The state register
        if (~reset)
            currentState<=A;
        else
            currentState<=nextState;
endmodule
```

The control RTL description can further be defined in terms of boolean equation RTL statements as shown below:

```
module synAssign (f, a, b, c);
    output f;
    input a, b, c;
    assign f = (a&b&c) | (a&~b&~c) | (~a&(b&c));
endmodule
```

The memory RTL description specifies memory descriptions in terms of modes of ports (the number and definitions of ports) and size of the memory.

In accordance with the method of synthesis as shown in FIG. 4A, the datapath, control, and memory RTL descriptions are technology mapped directly to system level re-configurable datapath, control, and memory structures which accept the RTL descriptions and are configured to whatever is specified in the RTL description thereby controlling the structures without the need to reduce the RTL descriptions to a gate and interconnect level.

In general, a technology mapper takes a generic RTL or gate level boolean description and "maps" this to a specific technology implementation. For example, a technology could consist of a 2-D array of 2 input NAND gate primitives. It can be shown that any digital macro function (AND, OR, XOR, XNOR, D flip-flop, half Adder, full Adder, multiplier, etc) can be decomposed into sets of 2 input NAND primitives. A tool that performs this realization would be called a "technology" mapper. For more complicated architectures, a technology mapper will map RTL/gate descriptions to the target architecture while performing the equivalent digital function. The technology mapper will use specific architectural domain knowledge to make this transformation as efficient as possible. An example of technology mapping is illustrated by FIGS. 4B and 4C where an adder composed of AND, XOR, and OR gates and having an associated truth table (FIG. 4B) is decomposed (or mapped) into 2 input NAND primitives (FIG. 4C).

The steps for technology mapping the control RTL description include creating a state diagram from the description, developing truth tables or karnaugh maps from the state diagrams, generating sum of product statements from the truth tables or karnaugh maps, and using the sum of product statements to drive and control the re-configurable fabric. It should be noted that the above steps can be implemented using a technology mapper algorithm which can reduce an RTL description or a boolean description to sum of product configuration signals for programming the re-configurable control fabric (i.e., FIGS. 10A and 10B) to provide control according to the RTL control description. Examples of technology mapping algorithms are Synopthis and Symplicity. Alternatively, the technology mapper can generate control information that can be mapped to addresses for accessing the re-configurable memory fabric. The re-configurable memory fabric, in turn, provides configuration data to the re-configurable datapath fabric.

Technology mapping the memory RTL description includes interpreting and mapping RTL memory statements to control bits for configuring the re-configurable memory fabric. For example, configuration bits are coupled to the transmission gates of a re-configurable memory fabric (shown in Figure) so that it is configured as called out in the RTL memory description statement. Technology mapping of the RTL datapath statements is performed by interpreting and mapping the statements to configuration bits for coupling to the datapath fabric to control it to perform the function as specified in the RTL datapath statement.

FIG. 5 shows a system for synthesizing a hardware logic circuit from an abstract level description of the hardware logic function. As indicated in FIG. 5, the description can be, for example, an algorithmic, (e.g., C program language description) or behavioral description of a function. The abstract level description is provided to a first synthesis tool (e.g. a behavioral synthesis tool) which, in turn, generates a physical-based description of system level structures. In one embodiment the physical-based description is an RTL description. The RTL description either explicitly or implicitly specifies higher level system physical structures. For example, an RTL description can include a specification of an arithmetic functional unit (e.g., adder, subtractor, etc.), boolean functions, memory size and port modality, state machine definitions and case statements (describing system control or state machines).

Hence, it should be noted that, whereas the higher level description provided to the behavioral tool is in terms of abstract statements, the resulting RTL description is in terms of inferred or explicitly called out physical higher level system structures. Moreover, it should be noted that the RTL description is not in terms of lower level physical elements such as gates and interconnections between gates.

The physical description (e.g., RTL description) is then partitioned into a datapath description, a control description, and a memory description. Partitioning is performed by evaluating (using either function specific hardware or a software algorithm) the list of statements making up the physical description and sorting these statements into groups of datapath, control, and memory statements. In one embodiment the tool provides a data flow graph which facilitates partitioning an RTL description netlist into a RTL datapath description, a RTL control description, and a RTL memory description. Each of the partitioned RTL descriptions is mapped using the technology mapper so as to provide control signals to the re-configurable data, memory, and control structures. Control signals can include opcodes, multiplexer select signals, clock enable signals, memory read/writes, etc. These signals allow higher order design intent to be retained from the higher level of abstraction description in a one-to-one fashion.

In accordance with one embodiment of the present invention, re-configurable datapath, control, and memory structures are re-configurable according to any of the instantiations listed in the datapath, control, and memory RTL netlists. The re-configurable structure (or fabric), including each of the datapath, control, and memory re-configurable structures are then controlled by the mapped control signals to realize the function as defined by the abstract level description.

One advantage of the system and method of the present invention is that prior art synthesis techniques reduce the abstract description into a description of gates and wires. As a result, the prior art must take into consideration gate and interconnect delays resulting in a granular control of the synthesized implementation. The present invention, on the other hand, reduces the abstract description to higher level physical structures and, as a result, granular delays do not need to be considered and increased system speed is realized. Moreover, since the re-configurable datapath, control and memory portions of the system of the present invention are higher level physical structures it is possible to structure them to provide fixed timing relationships that fall within guaranteed timing clock cycles resulting in a fixed timing delay. This is unlike the prior art synthesis techniques which must deal with structure dependent gate interconnect delays.

Moreover, the RTL description is in a much denser form than the lower level gate and interconnect description. In some cases, a single line of RTL description code may correspond to 10–100 lines of gate and interconnect level description code. Hence, eliminating the task of converting the RTL description down to a gate description can be a significant design time saver.

Re-Configurable Fabric
Datapath

The datapath portion of the re-configurable fabric is made-up of an array of datapath units (DPUs) which can be controlled to perform essentially any functions or operations specified by the datapath RTL netlist description as indicated in Table 1. FIG. 6A shows one embodiment of a DPU in accordance with the system and method of synthesis of the present invention. In one embodiment, each configurable datapath unit (DPU) includes N=4 multi-function processing units (PUs) each having two single bit inputs A(n) and B(n) (n=0–3), a carry-in input ($C_i(n)$), a control input Ctrl, a carry-out output ($C_o(n)$), and a sum output (S(n)).

The same control signal, DPU ctrl, applied to each PU programs the DPU to perform a given function. In one embodiment, the control signal is derived from the RTL datapath description. The DPU, dependent on the DPU ctrl signal, performs a selected operation on all or some of the input operands A, B, and Cin and outputs a resultant value to both or one of the S and Co outputs. Specifically, in response to the DPU ctrl signal, each PU performs the same single bit function on their single bit input A, B, and Cin operands. For instance, if DPU ctrl signal corresponds to an AND logic operation, the following simultaneous operations are performed on 4-bit A and B operands:

PU(0): A(0) AND B(0)=S(0);
PU(1): A(1) AND B(1)=S(1);
PU(2): A(2) AND B(2)=S(2);
PU(3): A(3) AND B(3)=S(3).

It should be noted that the Cin and C(out) values are not used when performing the above simple logic functions, as well as all other operations not involving addition, subtraction, incrementing, and decrementing. As a result, multiplexer 10, as well as its inputs (i.e., "1", Cin(1), Cin(2), and "0") are unused during these operations.

In the case in which the DPU ctrl signal corresponds to an operation involving addition, subtraction, incrementing, and decrementing, a Cin value is provided by multiplexer 10 and a C(o) value is generated by each of PU(0)–PU(3) of the 4-bit DPU. As shown in FIG. 6A, the Cin value can be set to several values via multiplexer 10 (i.e., "1", "0", Cin(1) and Cin(2)). When Cin is set to Cin(1), Cin is provided from the C(out) of an adjacent previous DPU in the same row or is provided by the computing system as a carrying operand. When Cin is set to Cin(2), Cin is provided from another DPU within the system which is not in the same row of DPUs. A mux control signal determines which value is coupled to the Cin of the DPU.

Hence, in the case in which the DPU shown in FIG. 6A is controlled to perform, for example, an addition operation between 4-bit A and B operands in which Cin(1) is selected by multiplexer 10, the following simultaneous operations are performed:

PU(0): A(0)+B(0)+Cin(1) to generate S(0) and Co(0)
PU(1): A(1)+B(1)+Co to generate S(1) and Co(1)
PU(2): A(2)+B(2)+Co(1) to generate S(2) and Co(2)
PU(3): A(3)+B(3)+Co(2) to generate S(3) and C(out)

FIG. 6B shows two DPUs interconnected into a single row to form a single datapath circuit having twice the input operand width of the single DPU. For instance, DPU(12A) is coupled to the first n bits of each of the A and B operands (i.e., (bit(0)–bit(n–1)) and DPU (12B) is coupled to the last n bits of the A and B operands (i.e., (bit(n) to bit(2n–1)). In this embodiment, in operations involving addition, subtraction, incrementing and decrementing, a Cin value is selected for DPU(12A) from inputs "1", "0", Cin(1), Cin(2), and the Cin value selected for DPU (12B) is Cin(1) coupled from the Cout of DPU(12A). When the DPU is programmed to perform operations not involving addition, subtraction, incrementing, and decrementing, the carry values are not used, carry outputs are not connected between DPUs, and each DPU operates on its corresponding n-bits of the operands to generate S(0)–S(2n–1). In addition, each DPU is programmed to perform the same function with the same DPU ctrl signal.

In order to form the datapath portion of the re-configurable fabric, groups of DPUs are arranged into arrays. Multiplexers controlled by the control portion of the re-configurable fabric are then used to direct data through the array of DPUs. Hence, the datapath portion is not only programmable to perform most functions or operations specified by the RTL description, it is also configurable to have a variable bandwidth. In one embodiment, the array of DPUs can be 32-bits wide. The DPUs and the multiplexers used to direct the data through the array of DPUs are controlled by the control portion of the re-configurable fabric such that it provides a new set of control signals each clock cycle or finite state of the control portion's finite state machine.

FIG. 6C shows an embodiment of a datapath system implemented with a plurality of configureable and programmable arrays of DPUs 50. Each array 50 includes 32 rows (Row 0–Row 31) of DPUs, each row of DPUs includes eight individual 4-bit DPUs, DPU(0)–DPU(7). Input and output data are multiplexed into and out of the array of DPUs depending on how the DPUs are interconnected and programmed and DPUs can be interconnected to form DPU circuits having varying input operand widths. For instance, for smaller input operands of 8-bits, two DPUs can be interconnected and programmed to perform an 8-bit operation. Alternatively, all of the DPUs in a given row can potentially be interconnected and programmed to perform a 32-bit operation (i.e., 8 4-bit DPUs per row). Also shown in FIG. 6C is the interconnection of DPUs between each array 50 to further increase data throughput. For example, a first row 51 and a second row 52 can be interconnected and programmed so as to perform operations greater than 32-bits (i.e., one row of DPUs) by routing the carryout bit (Co) of row 51 to the carryin bit (Ci) of row 52, thereby providing an extremely flexible datapath system.

FIGS. 6D–6F show different manners in which rows in an array 50 of DPUs can be interconnected and programmed.

FIG. 6D shows a Row 1 including DPU(0)–DPU(3) and a Row 2 including DPU(4)–DPU(7) interconnected together to form a DPU circuit which can perform a 32-bit additive or subtractive operation (i.e., addition, subtraction, incrementation, or decrementation) with a carryin bit Cin= "1". As described above with respect to FIG. 6B, the carryin bits passed between DPUs in the same row are coupled to the Cin(1) input of each DPU and the carryout bit passed from DPU(3) in Row 1 is routed and coupled to the Cin(2) input of DPU(4) in Row 2.

FIG. 6E shows two successive rows, a Row 1 including DPU(0)–DPU(3) and a Row 2 including DPU(4)–DPU(7), which are interconnected and programmed to perform two independent 16-bit additive or subtractive operations. As shown, Row 1 has a Cin="1" carryin operand and Row 2 has a Cin="0" carryin operand. In addition, each of the DPUs pass carryout bits to adjacent DPUs on the Cin(1) input port.

FIG. 6F shows five successive rows, a Row 1 including DPU(0)–DPU(3), a Row 2 including DPU(4)–DPU(7), a Row 3 including DPU(8)–DPU(11), a Row 4 including DPU(12)–DPU(15), and a Row 5 including DPU(16)–DPU(19) which are interconnected and programmed to perform a 64-bit additive or subtractive operation and a 16-bit operation which is not additive or subtractive. As shown, it is not necessary to interconnect successive rows in a given array. Specifically, the Row 2 carryout value is routed to the Cin(2) input of Row 4. In addition, it should be noted that carryin and carryout bits are not interconnected in Row 3 since DPU(8)–DPU(11) are programmed to perform an operation which does not utilize carry bits (e.g., AND function) and hence it is not necessary to pass carry bits to perform these types of functions. Alternatively, the carryin and carryout connections can be present between DPU(8)–DPU(11) and in a "don't care" condition.

FIG. 6G shows one embodiment of a single bit PU(n) within a DPU which can perform a plurality of operations. The PU is implemented as a modified adder having three single bit inputs A(n), B(n) and carry-in input, $C_i(n)$. The summation circuitry 20 including XOR gates 21 and 22 generates a summation resultant S(O) of A(n) and B(n) which is coupled to one of the inputs of the multiplexer 24. The carry generation circuitry 23 including logic gates 26–29 generates a carry-out value C(O) of the PU. In addition to S(O) and C(O), the PU also generates many intermediate logic, arithmetic, and conditional values and resultants thereby allowing the PU to perform a variety of different operations. For instance, the A AND B and A XOR B logic operation resultants can be extracted from the summation circuitry and carry generation circuitry from gates 26, and 21, respectively, and coupled to one of the inputs of multiplexer 24. Additional logic gate 25 is added to obtain the A OR B logic function which is also coupled to an input of multiplexer 24. Additional inverting gates 30–32 are added to the PU to negate the AND, OR, and XOR functions to generate NAND, NOR, and XNOR functions also coupled to the inputs of multiplexer 22. Dependent on the DPU ctrl signal (which corresponds to the DPU ctrl signal shown in FIG. 6A) the desired operation resultant coupled to the input of multiplexer 24 is passed to its output S(O). Hence, a datapath unit as shown in FIG. 6A implemented with processing units as shown in FIG. 6G can perform the following logic functions AND, NAND, NOR, OR, XOR, XNOR, as well as the mathematical addition functions. It should be understood that in accordance with the present invention, additional operations or functions not mentioned can be obtained through intermediate resultants within the processing unit or through the addition of logic circuitry, the resultants of which are then also coupled to the input of multiplexer 24.

The PU shown in FIGS. 6A and 6G can perform the following functions as shown below. In some cases additional circuitry is necessary as will be described herein and shown in FIGS. 7A–7D.

1) Name     ADD
   Opcode     0x00     0000000
   Pseudocode     result=A+B
   Description     A plus B, where Cin is set to 0
2) Name     ADDC
   Opcode     0x10     0010000
   Pseudocode     reset=A+B+Cin(1)
   Description     A plus B where Cin is provided as an input from the system or provided from an previous DPU
3) Name     ADDCNT
   Opcode     0x18     0011000
   Pseudocode     result = A+B+Cin(2)
   Description     A plus B where Cin=Cin(2) is configurably provided from the datapath system
4) Name     SUB
   Opcode     0x09     0001001
   Pseudocode     result = A−B=A+/B+1 (1's complement)
   Description     A minus B, select /B, and set Cin=1
5) Name     SUBC
   Opcode     0x11     0010001
   Pseudocode     result = A−B+Cin=A+/B+Cin (1's complement)
   Description     A minus B, select /B, and set Cin=Cin(1)
6) Name     SUBCNT
   Opcode     0x19
   Pseudocode     result = A−B+Cin(2)=A+/B+Cin(2) (1's complement)
   Description     A minus B, select /B, and set Cin=Cin(2)

```
 7) Name         SADD
    Opcode       0x20      0100000
    Pseudocode   if (overflow)
                     result = max
                 else if (underflow)
                     result = min
                 else
                     result = A+B
    Description  A plus B with saturation, Cin=0
 8) Name         SADDC
    Opcode       0x30      0110000
    Pseudocode   if (overflow)
                     result = max
                 else if (underflow)
                     result = min
                 else
                     result = A+B+Cin
    Description  A plus B and saturation, Cin=Cin(1)
 9) Name         SADDCNT
    Opcode       0x38      0111000
    Pseudocode   if (overflow)
                     result = max
                 else if (underflow)
                     result = min
                 else
                     result = A+B+Cin(2)
    Description  A plus B and saturation, Cin=Cin(2)
10) Name         SSUB
    Opcode       0x29      0101001
    Pseudocode   if (overflow)
                     result = max
                 else if (underflow)
                     result = min
                 else
                     result = A−B
    Description  A minus B with saturation, Cin=0
11) Name         SSUBC
    Opcode       0x31      0110001
    Pseudocode   if (overflow)
                     result = max
                 else if (underflow)
                     result = min
                 else
                     result = A−B+Cin(1)
    Description  A minus B with saturation, Cin=Cin(1)
12) Name         SSUBCNT
    Opcode       0x39      0111001
    Pseudocode   if (overflow)
                     result = max
                 else if (undeflow)
                     result = min
                 else
                     result = A−B+Cin(2)
    Description  A minus B with saturation, Cin=Cin(2)
13) Name         INC
    Opcode       0x0a      0001010
    Pseudocode   result = B+1
    Description  Increment B, Cin=1, A=0
14) Name         INCC
    Opcode       0x12      0010010
    Pseudocode   result = B+Cin(1)
    Description  Increment B, Cin=Cin(1), A=0
15) Name         DEC
    Opcode       0x04      0000100
    Pseudocode   result = B−1=B+A+0
    Description  Decrement B, Cin=0, A=1
16) Name         DECC
    Opcode       0x14      1001011
    Pseudocode   result = B−1=B+A+Cin(1)
    Description  Decrement B, Cin=Cin(1), A=1
17) Name         NEG
    Opcode       0x0b      0001011
    Pseudocode   result = ~B+1
    Description  Invert B and add 1, Cin=1
18) Name         NEGC
    Opcode       0x13      0010011
    Pseudocode   result = ~B+Cin(1)
    Description  Invert B and add Cin=Cin(1)
19) Name         ABS
    Opcode       0x4b      1001011
    Pseudocode   if (B negative)
                     result = ~B+1
                 else
                     result = B
    Description  Absolute value of B, Negate B and add Cin=1,
                 then check highest order bit of Sumout to see if
                 neg. or pos.
20) Name         ABSC
    Opcode       0x53      1010011
    Pseudocode   if (B negative)
                     result = ~B+Cin(1)
                 else
                     result = B
    Description  Absolute value of B, Negate B and add Cin=Cin(1),
                 then check highest order bit of Sumout to see
                 if neg. or pos.
21) Name         CSUB
    Opcode       0x49      1001001
    Pseudocode   if (A−B>0)
                     result = A−B
                 else
                     result = B
    Description  Conditional subtraction, A minus B, Cin=0,
                 then check highest order bit of Sumout to see if
                 neg. or pos to select result
22) Name         CSUBC
    Opcode       0x51      1010001
    Pseudocode   if (A−B>0)
                     result = A−B+Cin(1)
                 else
                     result = B
    Description  Conditional subtraction, A minus B, Cin=Cin(1),
                 then check highest order bit of Sumout to see if
                 neg. or pos. to select result
23) Name         AND
    Opcode       0x61      1100001
    Pseudocode   result = A&B
    Description  Bitwise AND
24) Name         OR
    Opcode       0x63      1100011
    Pseudocode   result = A|B
    Description  Bitwise OR
25) Name         NAND
    Opcode       0x60      1100000
    Pseudocode   result = ~(A&B)
    Description  Bitwise NAND
26) Name         NOR
    Opcode       0x62      1100010
    Pseudocode   result = ~(A|B)
    Description  Bitwise NOR
27) Name         XOR
    Opcode       0x65      1100101
    Pseudocode   result = A^B
    Description  Bitwise XOR
28) Name         XNOR
    Opcode       0x64      1100100
    Pseudocode   result = ~(A^B)
    Description  Bitwise XNOR
29) Name         PASSA
    Opcode       0x67      1100111
    Pseudocode   result = A
    Description  Pass A
30) Name         PASSB
    Opcode       0x6f      1101111
    Pseudocode   result = B
    Description  Pass B
31) Name         NOTA
    Opcode       0x66      1100110
    Pseudocode   result = ~A
    Description  Invert A
32) Name         NOTB
    Opcode       0x6e      1101110
    Pseudocode   result = ~B
    Description  Invert B
33) Name         MIN
    Opcode       0x0f      0001111
    Pseudocode   if (A<B)
                     result = A
```

|  |  |
|---|---|
|  | else |
|  | result = B |
| Description | Return smaller of A and B, conditional subtraction, A minus B, Cin=0, then check highest order bit of Sumout to see if neg. or pos. and select A or B |
| 34) Name | MAX |
| Opcode | 0x2f     0101111 |
| Pseudocode | if (A>B) |
|  | result = A |
|  | else |
|  | result = B |
| Description | Return larger of A and B, conditional subtraction, A minus B, Cin=0, then check highest order bit of Sumout to see if neg. or pos. and select A or B |

Explanation of Operations

The SUB operation is equivalent to performing the corresponding 1's complement addition operation A+invB+1. In this case, Cin is set to 1 and the input B operand is inverted before being applied to the DPU. In one embodiment, the inversion of the B operand is performed external to the DPU where the B operand and the inverse of the B operand is applied to the input of a multiplexer and is selectively coupled to the input of each PU as shown in FIG. 7A. The SUBC and SUBCNT operations are performed similar to the SUB operation however, instead of setting Cin=1, Cin is either set to Cin(1) or Cin(2).

The saturated addition operation, SADD, is performed by adding the A and B operands and then checking the results to see if the adder is saturated (i.e., in an overflow/underflow condition). In the case of an overflow, the result is set back to the maximum value and in the case of an underflow condition, the result is set to the minimum value. To implement this operation, the DPU performs the A+B operation and the two most significant bits of the sumout output of the DPU or a row of DPUs are used to select either a MAX value, a MIN value, or the A+B value from the Sumout output of each PU. In particular, if the two most significant bits of the sumout value are equal to "0" then an overflow condition has occurred and the MAX value is selected. If the two most significant bits of the sumout value are equal to "1" then an underflow condition has occurred and the MIN value is selected. Otherwise, the A+B value is selected. In one embodiment, the selection is performed using a multiplexer. The SADDC and SADDCNT operations are performed in the same manner as the SADD operation except that Cin is set as indicated.

The saturated substraction operations, SSUB, SSUBC, and SSUBCNT, are implemented by performing a subtraction operation as described for the SUB, SUBC, and SUBCNT operations followed by a saturation check at the end of the operation as described for the saturated addition operations, to select either a MAX, a MIN, or a A–B value.

The increment operation, INC, is performed by applying the value to be incremented to the B input and setting the A operand=0 and Cin=1. INCC is performed in a similar manner except the Cin value is set to Cin(1) in the case in which adjacent DPUs are connected and the carryout from a previous DPU is coupled to the Cin of the subsequent DPU. In this case the Cin of the first DPU in the row is coupled to "1" and the remainder of the DPUs in the row have Cin coupled to the Cout of the previous DPU in the row.

The DEC operation is performed by setting Cin=0 and A=1 which results in a 1's complement subtraction of B–A. The DECC operation is performed by setting Cin=Cin(1) and A=1 which results in a 1's complement subtraction of B–A+Cin(1).

The NEG operation is performed by setting Cin=1, selecting the negated B operand and adding invB+Cin. The NEGC operation is similarly performed except Cin=Cin(1).

The ABS operation is performed by setting Cin="1", selecting the negated B operand, adding invB+Cin, and then selecting either the sumout output of the DPU or the B operand using a multiplexer dependent on whether the highest order bit of the B operand is positive (B[15]=0) or negative (B[15]=1). FIG. 7B shows one embodiment of a PU circuit implementation utilized to perform the ABS operation. The ABSC operation is performed similarly by setting Cin=Cin(1).

The conditional subtraction (CSUB) is implemented by performing a subtraction operation (SUB) and then determining if the sumout highest order bit is positive or negative. If the sumout is positive, the sumout result is selected and if sumout is negative, the B operand is selected. FIG. 7C shows one embodiment of a PU circuit implementation utilized to perform the CSUB operation. The CSUBC operation is performed similarly by setting Cin=Cin(1).

The logical operations AND, OR, NAND, NOR, XOR, and XNOR are obtained from within each PU and are multiplexed to the output of the PU using the control signal to select which operation resultant is passed to the S(O) of each PU in the DPU.

The PASSA and PASSB operations which pass either the A or B operands through the DPU can be implemented is several manners. For instance, an addition operation can be performed where the A operand is added to a B operand that is set to "0" or visa versa. Alternatively, the A and B operands can be coupled directly to the multiplexer 24 of the PU and selectively passed to the S(O) of the PU.

The MIN and MAX operations are implemented by performing a conditional SUB and using the higher order bit of the sumout to select either A or B depending on whether a MAX or MIN operation is being performed. FIG. 7D shows one embodiment of a PU circuit implementation utilized to perform the MIN and MAX operations and depending on which operation is performed (MAX or MIN) the most positive or negative operand is chosen by S[15].

Hence, in accordance with the embodiments shown in FIGS. 6A–6G and 7A–7D the above operations can be performed.

FIG. 8 shows an embodiment of a DPU having a configuration of logical modified adders including a top row of four 1-bit modified adders, PU(0)–PU(3), and a bottom row of four 1-bit modified adders, PU(4)–PU(7). Each PU has four single bit inputs and two single bit outputs—a first input operand A, a second input operand B, a carrying input Ci, a control input ctrl, a sumout output So and a carryout output Co.

The DPU includes input data ports A(0)–A(3) and B(0)–B(3) for receiving corresponding input operand signals. Each PU is controlled by the same DPU ctrl signal coupled to its ctrl input port. The DPU ctrl signal controls all of the PUs in FIG. 4 to perform the same function on the input operands.

The PUs are arranged so as to form four stacks of PU pairs, including stacks PU(0)/PU(4), PU(1)/PU(5), PU(2)/PU(6), and PU(3)/PU(7) each stack generating a single bit sumout output signal on DPU ports S(0)–S(3). The carryout signal for coupling to a next adjacent DPU is generated on port NextC(3).

The DPU also includes an input port AP(I) for receiving a single A operand bit from a previous DPU in order to implement a single-bit shift operation. The AP(I) port provides a means of multiplying the A operand by 2 by shifting it to the left by one bit location. This operation (i.e., multiply by 2) is useful when using the DPU to perform a Booth's Algorithm multiplication as will be described herein.

The DPU also includes a plurality of multiplexers that direct data into, through, and out of the configuration of modified adders dependent on select control signals (not shown) coupled to the plurality of multiplexers. The select control signals are mapped from the RTL control description statements. In particular, when the DPU is used to form a multiplication unit, the multiplexers are set into a particular setting to direct data within the DPU in a manner as required to perform the multiplication operation. Alternatively, when the DPU is controlled to perform other operations such as operations 1–34 as described above, the multiplexers are set into different settings to direct data within the DPU in an alternate manner. The multiplication operation is performed using both top and bottom rows of PUs. Operations involving addition, subtraction, incrementation and decrementation use either the top or bottom row depending on the carry value NextC(3)' value from the previous DPU. In general, the remainder of the operations use the top row DPUs and bypass the bottom row of PUs.

A first set of eight multiplexers 50 each determines which single bit A operand is coupled to the input of its corresponding PU. Each multiplexer 50 has one of its inputs coupled to its corresponding single bit A operand, A(n), the other of its inputs coupled to the single bit A operand of the adjacent PU, A(n−1), and its output coupled to the A input port of its corresponding PU. For instance, multiplexer 50 corresponding to PU(1) has a first input coupled to the A(1) signal, a second input coupled to the A(0) signal, and has its output coupled to the A input port of PU(1). In the case of the first and last PUs (i.e., PU(0) and PU(3)), the AP(I) input signal provides the single bit A operand from the previous DPU. Allowing the selection of the A operand in this manner allows for single-bit shift operations and for the multiplication of the A operand by 2 prior to coupling the A operand to it corresponding A input port.

The DPU further includes a second set of four multiplexers 59, each corresponding to one pair of stacked PUs and each determining if the sum output is taken from the top PU or the bottom PU in the stack. For instance, multiplexer 59 corresponding to the PU(0)/PU(4) stack has one input coupled to the So signal (signal 55) generated by PU(0) and its other input coupled to the So signal generated by PU(4) and determines if S(0) is taken from either PU(0) or PU(4). The multiplexers 59 are controlled by the previous DPU's carryout bit NextC(3)'.

The DPU also includes a third set of four multiplexers 52 and a fourth set of four multiplexers 54, each corresponding to one of the eight PUs for selectively directing carrying bits into the carrying input (Ci) of each of the PUs. Each of the multiplexers 52 and 54 has a first input coupled to the carryout (Co) bit from the previous (PU(n−1)) in the same row and has a second input coupled to a carry bit Cm(n). The Cm(n) is a carry bit that is used when performing a multiplication operation. Each of the multiplexers 52 are coupled to the same control signal (not shown) and each of the multiplexers 54 are coupled to the same control signal (not shown) such that each of the top and bottom row PUs receive their carryin bits in the same manner.

The DPU also includes a 2-to-1 multiplexer 40 having its inputs coupled to the carry outputs (Co) from the top and bottom left most PUs (i.e., PU(3) and PU(7)) and having its control input coupled to the NextC(3)' control signal from the previous adjacent DPU. Multiplexer 40 is used to determine whether the top or bottom row of PUs provides the NextC(3) carry out signal to the next DPU.

The DPU further includes multiplexer 51 and 53, which direct data into the B operand input of the top and bottom rows of PUs, respectively. Specifically, multiplexers 51 and 53 couple either the single bit B(n) operand to the B input port of each PU(n) for most operations or a single bit sum output Sm(n) from an upper row PU when performing a multiplication operation.

In one embodiment, the PUs in the DPU shown in FIG. 8 are implemented as shown in FIGS. 6B, 6G and 7A–7D and hence can perform a plurality of operations as described for the embodiment of the DPU shown in FIG. 6A. These operations are implemented by applying multiplexer control input signals provided from the reconfigurable memory portion according to the RTL control description to direct data through the DPU and by applying the DPU control signal derived from the RTL datapath description to each PU to perform a selected operation.

Logical Operations

To perform a bitwise logic operation, such as an A bitwise AND B operation, the DPU shown in FIG. 8 is set in the following manner:

1) multiplexers 50 are set to pass A(n) to the A input port of each PU(n);
2) multiplexers 51 and 53 are set to pass B(n) to the B input port of each PU(n);
3) the DPU ctrl signal is set to control each PU(n) to perform a single bit AND operation on each pair of single bits A(n) and B(n) coupled to each PU(n);
4) multiplexers 59 are set to select the So(n) from the top PU(n) in each stack of PUs.
5) the remainder of the inputs, PUs, and multiplexers are in a "don't care" condition.

In the case in which each PU is implemented as shown in the embodiment of FIG. 6G, multiplexer 24 is controlled by the DPU ctrl signal to pass the A AND B resultant to the S(O) output of each PU, such that each PU performs a single bit AND operation on its corresponding single bit A(n) and B(n) operands. The Ci(n) and C(O) are in "don't care" conditions.

Operations Involving Addition, Subtraction, Incrementation, or Decrementation

To perform an operation involving addition, subtraction, incrementing, and decrementing which utilizes carry values, the DPU is set in the following manner:

1) multiplexers 50 are set to pass A(n) to the A input port of each PU(n);
2) multiplexers 51 and 53 are set to pass B(n) to the B input port of each PU(n);
3) multiplexers 52 and 54 are set such that:
   a) PU(n) receives its carryin value from the previous PU(n−1) for PU(1)–PU(3);
   b) PU(0) receives a carryin value of "0"; and
   c) PU(4) receives a carryin value of "1";
4) the DPU ctrl signal is set to control each PU(n) to perform a single bit addition operation on each pair of single bits A(n) and B(n) coupled to each PU(n) such that each of the top and bottom rows of PUs generate a 4-bit sumout value and a single bit carryout value from PU(3) and PU(7), respectively;
5) multiplexers 59 are set to select the 4-bit sumout value from either of the top or bottom row of PUs dependent on the previous NextC(3)' control signal provided from a previous DPU stage or system control as follows:
   a) if the carryin signal is to be "0" (i.e., Cin="0", FIG. 8) then the NextC(3)' control is set to pass the 4-bit sumout value from the top PU(n) in each stack of PUs;

b) if the carryin signal is to be "1" (i.e., Cin="1", FIG. 8) then the NextC(3)' control is set to pass the sumout value from the bottom PU(n) in each stack of PUs;

6) multiplexer 40 is set to select Co from either PU(3) or PU(7) dependent on the NextC(3)' control signal.

Hence, for operations involving addition, subtraction, incrementation, or decrementation, a 4-bit addition is performed on the A and B operands by each of the top and bottom rows of PUs to generate a 4-bit top sumout value and a 4-bit bottom sumout value as well as a single bit top carry out value from PU(3) and a single bit bottom carry out value from PU(7). The NextC(3)' control signal then selects which sumout and carryout (top or bottom) is passed from the output ports S(0)–S(3) and NEXTC3 of the DPU. In the case in which each PU is implemented as shown in the embodiment of FIG. 6G, multiplexer 24 is controlled by the DPU ctrl signal to pass the summation resultant to the S(O) output of each PU and the carryout resultant to the C(O) output of each PU, such that each PU performs a single bit addition operation on its corresponding single bit A(n), B(n), and Ci(n) operands. The C(O) value is then coupled to the next adjacent PU in the DPU. It should be noted that as described above, subtractive operations are equivalent to performing a 2's complement addition operation and adding a carryin bit of "1".

It should also be noted that in the case in which the DPU is the first in a row of DPUs (e.g., DPU(12A) in FIG. 6B) the NextC(3)' control signal is determined by multiplexer 10 as shown in FIG. 6A and consequently can be one of "1", Cin(1), Cin(2), or "0". Alternatively, if the DPU is a subsequent DPU in the row of DPUs (e.g., DPU(12B) in FIG. 6B) the NextC(3)' control signal is coupled to the Cin(1).

Control

The control portion of the re-configurable structure (or fabric) is made up of a plurality of control logic units (CLUs). The goal of the control portion is to provide state machine control in the form of state control bits, process results of the datapath for next state control bit determination, handshake signaling to I/O pins, and provide a polling interface to the CPU (within the system controlling the hardware synthesis system using the re-configurable fabric) as well as an interrupt capability.

In one embodiment, a DPU control interface block is at the boundary of the configurable control logic unit (i.e., CLU) control blocks and the DPU datapath fabric. The DPU control interface block contains a tri-state system that routes appropriate signal outputs from the CLU to the specific set of DPU row signals to effect proper machine sequencing and signal routing operation.

A CLU (FIG. 9) includes a programmable control array (PCA) and a programmable state array (PSA). The CLU provides state control bits to access the memory structure so as to provide configuration bits to the datapath structures (i.e., DPUs) through the DPU control interface for controlling the multiplexers within each DPU and for controlling multiplexers which route input and output data between the reconfigurable memory and the reconfigurable datapath portion. The PSA is a structure that supports state control bit storage. The PCA is a structure that supports FSM (finite state machine) and combinatorial cone of logic mappings to generate state control bits. The PCA can either output state control bits directly to a DPU control interface or can provide the state control bits to the PSA block. The outputs of the PSA can also be selected to provide state control bits to the DPU control interface.

One embodiment of the PCA (FIG. 10A) is a programmable configurable PLA that is fully populated as to possible connectivity for the input true and false bit lines to the corresponding AND term outputs of the PLA for input into the OR plane of the PLA. Each programmable connection point 100 in the AND and OR planes consists of a pass transistor that is controlled by a configuration bit from a set of configuration bits. As a result, the PLA can be re-configured to perform any boolean function for one state and then reprogrammed to perform a different boolean function in another state depending on the configuration bit coupled to the pass transistor. Additional wires (not shown) can be routed out of each PCA for chaining product terms and sum of product groupings of each of the programmable and configurable PLAs to further increase configurability. FIG. 10B shows an example of a programmable connection 100 in the AND plane. The configuration bits determine whether a connection is programmed between the input operand line and the product term line. If a configuration bit is selected from the set of configuration bits that causes switching device 103 to be on and device 102 to be off, then a connection is programmed for that product term. Otherwise, if the selected configuration bit turns device 103 off and device 102 on, then no connection or product term is programmed.

The PSA consists of memory modules, each corresponding to one plane of logic state information which is accessed by the PCA and which is applied to the DPU control interface for a given logic state. The technology mapping interprets the configured control bits provided from the mapped RTL control signals to synthesize the state selection logic for accessing the memory modules.

Memory

Local memories are arranged in slices of many local memories to form LSMs (Local Storage Memories). The LSMs are interconnected with transmission gates such that LSMs can be partitioned into smaller or larger memories. Consequently, different DPUs can perform read and write accesses with different local memories depending on the state of the transmission gates. As a result, the memory can be aggregated into smaller or larger memory blocks having a variable port modality.

FIG. 11A is a diagram showing memory re-configurability of a single local memory with a logical representation of a single DPU. As shown, a local memory 60 is interconnected with a logical representation of a datapath unit including the operation unit 62 which can do operations 1–34 upon the inputs A, B, and C (lines 64 and 66). The inputs on line 64 and 66 can come from a local memory, or other datapath units. The local memory 60 preferably includes three ports; a local write port, including a write address 60a and write data 60b; a local read port including a read address 60c and read data 60d; and system port including a system address line 60e, and system data line 60f. The output of the data operation unit 62 can be sent using the data buffer 68, 70, or 72, to provide the write address for the local memory unit, the write data for the local memory unit, or the read address for the local memory unit. Alternately the write address, the write data, or the read address can be obtained from another element connected to the local read address, write address, or write data line.

Reconfigurable connections on the local bus lines allow segments of the bus line to be interconnected or isolated as desired. The reconfigurable connections can be implemented as transmission gates or pairs of directional gated buffers. Such reconfigurable connections are provided for each bit of the bus lines.

The reconfigurable connections 74, 76, 78, 80, 82, 84, 86, and 88, can provide connections on the local address and data busses. The gated buffer 90 allows the read data from the local memory to write to the read data bus.

The output from the operation unit 62 also can be sent across the multiplexer 92 to provide the output on line 94. The multiplexer 92 can alternatively send the read data from local memory 60 out as the output. In addition to the local connection, the local memory unit also has a global access port. The global access port includes the system address and system data connections 60e and 60f which are connected to the system address and system data lines. These lines can connect to a system memory (not shown) using a DMA controller and system address and data buses. This allows data from the system memory to be written and read into the local memory.

FIG. 11B shows memory configurability of a plurality of local memories. Specifically, FIG. 11B illustrates the interconnection of local memories 100, 102, 104, using the reconfigurable interconnects 106a, 106b, 106c, 106d, and 108a, 108b, 108d. By using the reconfigurable connections, different segments of the local busses can be interconnected or can be isolated. When the segments are isolated, different addresses and data can be placed onto different segments.

FIG. 11C shows memory configurability of multiple DPUs and local memories. Specifically, FIG. 11C illustrates the interconnection of multiple data processing units along with the local memory units. The local memory unit 120 can have a read address sent from the datapath units 122, 124, or 126. If the route address is derived from datapath unit 122, the data buffer 128 is turned on allowing the address from the data processing unit to go to the read address port line of the local memory unit 120. If reconfigurable connection 130 is turned on, the read address can be sent to the read address line on local memory unit 132. When consecutive transmission gates 130, 136, to 138 are turned on the read address is sent to a consecutive block of local memory units down to local memory unit 134.

If the interconnect 130 is on, the gated buffer 140 is turned off to prevent a conflict on the read address line. Note that when the reconfigurable connection 130 is turned off, the read address value for the local memory 132 and the read address for local memory unit 120 can be different, since the segments 142a and 142b on the read address bus line are isolated from one another by the reconfigurable connection 130.

The data read from the local memory unit 120 can be sent through the datapath unit 122. Using the reconfigurable connections 144, 146, and 148, the data can be sent to adjacent datapath units. If the identity (ID) bits of local memory unit 120 match the corresponding bits in the read address transmission gate 152 is turned on. The ID bits in the local memory unit 120 are setable by the configuration memory of the system. Control for the transmission gates is provided from the reconfigurable control portion.

Interaction Between Control, Datapath, and Memory

FIGS. 12A illustrates the interaction between the control, datapath, and memory portions of the re-configurable fabric. Specifically, FIG. 12A shows a functional block diagram of a data processing unit (DPU) coupled to a local memory. The datapath unit functionally includes an operator, operand multiplexer, memory and control logic. Each DPU operator is compatible with operations specified by the behavior tool output language (i.e., the RTL description). The operator is also capable of generating address fields for providing to a configurable memory (i.e., LSM) port. Input multiplexers are available to select input operands A and B (as shown in FIG. 7A), depending on control provided by the control portion or the datapath portion of the re-configurable fabric. Moreover, conditional information generated by the operator can be made available to the control block to allow it to implement state machines and sequencing.

FIG. 12B is a block diagram generally showing control interaction of the data, control, and memory portions of the reconfigurable fabric. The PLAs (or PCAs) output control bits that are mapped to the local memories to access configuration state bits which are, in turn, coupled to the DPU. The configuration bits control the DPU multiplexers to perform the function as determined by the RTL datapath description statements and RTL control description statements for each state condition or clock cycle. The local memories are configured by the RTL control description to facilitate data flow into and out of the DPUs during each state.

In the preceding description, numerous specific details are set forth, such as specific bus widths in order to provide a thorough understanding of the present invention. It will be apparent, however, to one skilled in the art that these specific details need not be employed to practice the present invention. In other instances, well known logic structures and components have not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What is claimed is:

1. A method of synthesizing the datapath of a logic system, said datapath having an associated functional behavior, said method comprising essentially the steps of:
   providing a first abstract description of encoded statements specifying said functional behavior of said datapath of said logic system to a behavioral synthesis tool to generate a second physical description of encoded statements specifying system level circuit structures for performing said functional behavior of said datapath of said logic system;
   partitioning said second description into a plurality of sub-descriptions corresponding to functional system blocks having at least a datapath block;
   mapping said sub-descriptions to a set of control signals;
   controlling an array of re-configurable datapath circuits with said set of control signals to perform said functional behavior of said datapath of said logic hardware, said array being controlled by said set of control signals so as to configure said datapath circuits into groups of datapath circuits to form larger datapath structures to provide increased data throughput and said array being controlled such that said datapath circuits and datapath structures each perform a selected one of a plurality of different functions to simulate said functional behavior of said logic system.

2. The method as described in claim 1 wherein said first description is in terms of a behavioral description code.

3. The method as described in claim 1 wherein said second description is in terms of a register-transfer-level (RTL) description code.

4. The method as described in claim 1 wherein said first description is in terms of an algorithm which performs said functional behavior of said logic system.

5. A method of synthesizing a logic system having an associated functional behavior, said method comprising essentially the steps of:

provinding a first abstract description of encoded statements specifying said functional behavior of said logic system to a behavioral synthesis tool to generate a second physical description of encoded statements specifying system level structures for performing said functional behavior of said logic system;

partitioning said second description into a plurality of sub-descriptions corresponding to functional system blocks within said logic system, wherein said functional system blocks have a control block comprising a plurality of re-configurable programmable logic units to perform a selected one of a plurality of boolean functions that generates configuration bits for each finite state;

mapping each of said plurality of sub-descriptions to a set of control signals to generate a plurality of sets of control signals, each set of control signals corresponding to one of said functional system blocks;

controlling a plurality of re-configurable circuit blocks each corresponding to one of said functional system blocks with said sets of control signals, wherein said plurality of re-configurable circuit blocks simulates said functional behavior of said logic system.

6. The method as described in claim 5 wherein said functional system blocks include a control block and a memory block.

7. The method as described in claim 5 wherein said sub-descriptions include a control RTL sub-description, a datapath RTL sub-description, and a memory RTL sub-description.

8. The method as described in claim 5 wherein said first description is in terms of a behavioral description code.

9. The method as described in claim 5 wherein said second description is in terms of a register-transfer-level (RTL) description code.

10. The method as described in claim 5 wherein said first description is in terms of an algorithm which performs said functional behavior of said logic system.

11. The method as described in claim 10 wherein said algorithm is a kernal described in C programming language syntax within a higher level C program.

12. A system for synthesizing a logic system having an associated functional behavior, comprising:

a means for performing a behavioral synthesis using a first-abstract-based description of said functional behavior of said logic system to generate a second physical-based description of system level structures for performing said functional behavior of said logic system;

a means for partitioning said second description into a plurality of sub-descriptions corresponding to functional system blocks having at least a control block within said logic system, wherein said control block comprises a plurality of re-configurable programmable logic units for being configured during each finite state of said system to perform a selected one of a plurality of boolean functions to generate configuration bits for said each finite state and a means for storing finite state configuration bits;

a means for mapping each of said plurality of sub-descriptions to a set of control signals to generate a plurality of sets of control signals, each set of control signals corresponding to one of said functional system blocks; and a plurality of re-configurable circuit blocks each corresponding to one of said functional system blocks controlled by said sets of control signals so as to cause said plurality of said re-configurable circuit blocks to simulate said functional behavior of said logic system.

13. The system as described in claim 12 wherein said means for performing behavioral synthesis is a behavioral synthesis tool.

14. The system as described in claim 12 wherein said first description is in terms of a behavioral description code.

15. The system as described in claim 12 wherein said second description is in terms of a register-transfer-level (RTL) description code.

16. The system as described in claim 12 wherein said first description is in terms of an algorithm which performs said functional behavior of said logic system.

17. The system as described in claim 16 wherein said algorithm is a keral described in C programming language syntax within a higher level C program.

18. The system as described in claim 12 wherein said functional system blocks include a control block and a memory block.

19. The system as described in claim 12 wherein said functional system blocks include at least a datapath block.

20. The system as described in claim 19 wherein said datapath block comprises an array of re-configurable datapath circuits each capable of being configured to perform a selected one of a plurality of different functions, said array being controlled by said set of control signals so as to configure said datapath circuits into groups of datapath circuits to form larger datapath structures to provide increased data throughput and said array being controlled such that said datapath circuits and datapath structures each perform a selected one of said plurality of different functions to simulate said functional behavior of said logic system.

21. The system as described in claim 12 wherein said functional system blocks include at least a memory block.

22. The system as described in claim 21 wherein said memory block comprises a plurality of local storage memories which are re-configurable into larger memory blocks so as to provide variable sized memory blocks having variable modalities of ports in each of a plurality of finite states.

23. A system for synthesizing a logic system having an associated functional behavior comprising:

a means for performing a behavioral synthesis using a first-abstract-based description of said functional behavior of said logic system to generate a second physical-based description of system level structures for performing said functional behavior of said logic system;

a means for partitioning said second description into a plurality of sub-descriptions corresponding to functional system blocks having at least a datapath block within said logic system;

a means for mapping each of said plurality of sub-descriptions to a set of control signals to generate a plurality of sets of control signals, each set of control signals corresponding to one of said functional system blocks; and a plurality of re-configurable circuit blocks each corresponding to one of said functional system blocks controlled by said sets of control signals so as to cause said plurality of said re-configurable circuit blocks to simulate said functional behavior of said logic system;

wherein said datapath block comprises an array of re-configurable datapath circuits each capable of being configured to perform a selected one of a plurality of different functions, said array being controlled by said set of control signals so as to configure said datapath circuits into groups of datapath circuits to form larger datapath structures to provide increased data throughput and said array being controlled such that said datapath circuits and datapath structures each perform a selected one of said plurality of different functions to simulate said functional behavior of said logic system.

24. The system as described in claim 23 wherein said means for performing behavioral synthesis is a behavioral synthesis tool.

25. The system as described in claim 23 wherein said first description is in terms of a behavioral description code.

26. The system as described in claim 23 wherein said second description is in terms of a register-transfer-level (RTL) description code.

27. The system as described in claim 23 wherein said first description is in terms of an algorithm which performs said functional behavior of said logic system.

28. The system as described in claim 27 wherein said algorithm is a kernal described in C programming language syntax within a higher level C program.

29. The system as described in claim 23 wherein said functional system blocks include a control block and a memory block.

30. A system for synthesizing a logic system having an associated functional behavior comprising:

a means for performing a behavioral synthesis using a first-abstract-based description of said functional behavior of said logic system to generate a second physical-based description of system level structures for performing said functional behavior of said logic system;

a means for partitioning said second description into a plurality of sub-descriptions corresponding to functional system blocks having at least a memory block within said logic system, wherein said memory block comprises a plurality of local storage memories which are re-configurable into larger memory blocks so as to provide variable sized memory blocks having variable modalities of ports in each of a plurality of finite states;

a means for mapping each of said plurality of sub-descriptions to a set of control signals to generate a plurality of sets of control signals, each set of control signals corresponding to one of said functional system blocks; and a plurality of re-configurable circuit blocks each corresponding to one of said functional system blocks controlled by said sets of control signals so as to cause said plurality of said re-configurable circuit blocks to simulate said functional behavior of said logic system.

31. The system as described in claim 30 wherein said means for performing behavioral synthesis is a behavioral synthesis tool.

32. The system as described in claim 30 wherein said first description is in terms of a behavioral description code.

33. The system as described in claim 30 wherein said second description is in terms of a register-transfer-level (RTL) description code.

34. The system as described in claim 30 wherein said first description is in terms of an algorithm which performs said functional behavior of said logic system.

35. The system as described in claim 34 wherein said algorithm is a kernal described in C programming language syntax within a higher level C program.

36. The system as described in claim 30 wherein said functional system blocks include a control block and a datapath block.

* * * * *